United States Patent
Kim et al.

(10) Patent No.: US 12,268,009 B2
(45) Date of Patent: Apr. 1, 2025

(54) MEMORY DEVICE INCLUDING VERTICAL STACK STRUCTURE, METHOD OF FABRICATING THE SAME, AND ELECTRONIC DEVICE INCLUDING MEMORY DEVICE

(71) Applicant: Samsung Electronics Co., Ltd., Suwon-si (KR)

(72) Inventors: Yumin Kim, Seoul (KR); Doyoon Kim, Hwaseong-si (KR); Seyun Kim, Seoul (KR); Hyunjae Song, Hwaseong-si (KR); Seungyeul Yang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 427 days.

(21) Appl. No.: 17/685,942

(22) Filed: Mar. 3, 2022

(65) Prior Publication Data
US 2023/0093892 A1    Mar. 30, 2023

(30) Foreign Application Priority Data
Sep. 24, 2021   (KR) .......................... 10-2021-0126711

(51) Int. Cl.
 *H10B 63/00* (2023.01)
 *H10N 70/00* (2023.01)
 *H10N 70/20* (2023.01)

(52) U.S. Cl.
 CPC ............. *H10B 63/34* (2023.02); *H10B 63/84* (2023.02); *H10B 63/845* (2023.02); *H10N 70/066* (2023.02); *H10N 70/24* (2023.02); *H10N 70/8265* (2023.02); *H10N 70/8833* (2023.02); *H10N 70/881* (2023.02)

(58) Field of Classification Search
None
See application file for complete search history.

(56) References Cited

U.S. PATENT DOCUMENTS

| | | |
|---|---|---|
| 8,085,583 B2 | 12/2011 | Suh |
| 8,427,865 B2 | 4/2013 | Shima et al. |
| 8,829,590 B2 | 9/2014 | Park |
| 9,059,395 B2 | 6/2015 | Ju et al. |
| 9,093,369 B2 | 7/2015 | Shin et al. |
| 9,947,685 B2 | 4/2018 | Fujii et al. |

(Continued)

FOREIGN PATENT DOCUMENTS

| | | | | |
|---|---|---|---|---|
| CN | 112002801 A | * | 11/2020 | ............ H10B 63/80 |
| CN | 112466879 A | * | 3/2021 | ....... H01L 21/02178 |

*Primary Examiner* — Scott B Geyer
(74) *Attorney, Agent, or Firm* — Harness, Dickey & Pierce, P.L.C.

(57) ABSTRACT

Disclosed are a memory device including a vertical stack structure, a method of manufacturing the same, and/or an electronic device including the memory device. The memory device including a vertical stack structure includes an oxygen scavenger layer on a base substrate, a recording material layer on the oxygen scavenger layer and in direct contact with the oxygen scavenger layer, a channel layer on the recording material layer, a gate insulating layer on the channel layer, and a gate electrode on the gate insulating layer. The oxygen scavenger layer includes an element that forms oxygen vacancies in the recording material layer and does not include oxygen.

40 Claims, 32 Drawing Sheets

(56) References Cited

U.S. PATENT DOCUMENTS

| | | | |
|---|---|---|---|
| 9,947,686 B2 | 4/2018 | Son et al. | |
| 9,966,136 B2 | 5/2018 | Ogiwara et al. | |
| 2013/0005132 A1* | 1/2013 | Frank | H10B 41/30 257/E21.209 |
| 2014/0145137 A1* | 5/2014 | Ju | H10B 63/84 257/2 |
| 2015/0028279 A1* | 1/2015 | Hopstaken | H10N 70/841 257/4 |
| 2017/0062713 A1* | 3/2017 | Takagi | H10B 63/24 |
| 2017/0141161 A1* | 5/2017 | Sakotsubo | H10N 70/828 |
| 2017/0317140 A1* | 11/2017 | Wicklein | H10N 70/801 |
| 2017/0358588 A1* | 12/2017 | Ando | H01L 29/792 |
| 2018/0145253 A1* | 5/2018 | Zhou | H10N 70/8833 |
| 2018/0212147 A1* | 7/2018 | Ruiz | H10N 70/021 |
| 2019/0044064 A1* | 2/2019 | Hakamata | H10N 70/023 |
| 2020/0203430 A1 | 6/2020 | Lee et al. | |
| 2020/0266345 A1 | 8/2020 | Yoon et al. | |
| 2020/0343446 A1* | 10/2020 | Chiang | H10B 63/24 |
| 2021/0035635 A1 | 2/2021 | Yoon et al. | |
| 2021/0035641 A1 | 2/2021 | Yoon et al. | |
| 2021/0074914 A1* | 3/2021 | Lee | H10B 63/10 |
| 2021/0202833 A1 | 7/2021 | Kim et al. | |
| 2021/0202840 A1 | 7/2021 | Kim et al. | |
| 2021/0217473 A1 | 7/2021 | Cho et al. | |
| 2021/0408114 A1* | 12/2021 | Lille | H10N 50/01 |
| 2022/0020437 A1 | 1/2022 | Kim et al. | |
| 2022/0020818 A1 | 1/2022 | Kim et al. | |
| 2022/0052259 A1 | 2/2022 | Kim et al. | |
| 2022/0077235 A1 | 3/2022 | Kim et al. | |
| 2022/0093860 A1* | 3/2022 | Loy | H10N 70/063 |
| 2022/0246679 A1 | 8/2022 | Cho et al. | |
| 2022/0302380 A1 | 9/2022 | Mizusaki et al. | |
| 2022/0310827 A1 | 9/2022 | Kim et al. | |
| 2023/0121581 A1 | 4/2023 | Kim et al. | |

\* cited by examiner

MEMORY DEVICE INCLUDING VERTICAL STACK STRUCTURE, METHOD OF FABRICATING THE SAME, AND ELECTRONIC DEVICE INCLUDING MEMORY DEVICE

CROSS-REFERENCE TO RELATED APPLICATION

This application is based on and claims priority under 35 U.S.C. § 119 to Korean Patent Application No. 10-2021-0126711, filed on Sep. 24, 2021, in the Korean Intellectual Property Office, the disclosure of which is incorporated by reference herein in its entirety.

BACKGROUND

Some example embodiments relate to a memory device, and more particularly, to a memory device having a structure in which a plurality of memory cells is vertically stacked, a method of fabricating the same, and/or an electronic device including the memory device.

Semiconductor devices are generally classified into memory devices and logic devices. Memory devices are used to store data.

Semiconductor memory devices are generally classified into volatile memory devices and non-volatile memory devices. Volatile memory devices lose data stored thereon when the power supply is interrupted, and examples of volatile memory devices include dynamic random-access memory (DRAM) devices and static random-access memory (SRAM) devices.

Non-volatile memory devices retain data stored thereon even when the power supply is interrupted, and examples of non-volatile memory devices include programmable read-only memory (PROM) devices, erasable PROM (EPROM) devices, electrically EPROM (EEPROM) devices, and flash memory devices.

Next-generation semiconductor memory devices, for example, magnetic random-access memory (MRAM), phase-change random-access memory (PCRAM), and resistive random-access memory (ReRAM) have recently been developed to at least partially meet the trend of high performance and low power consumption of semiconductor memory devices. Materials of these next-generation semiconductor memory devices may have resistance values that change according to currents, voltages, and/or heat applied thereto and may retain their resistance values even when currents or voltages are interrupted. Research for applying these memories in the form of vertical NAND (VNAND) is being conducted. Many or most of the NAND flash products occupying the majority of the current memory market are VNAND products, which are advantageous for improving integration density. However, these VNAND products currently approach the allowable height limit in chip packaging, and thus it is necessary or desirable to study a method of scaling a unit cell. When the next-generation semiconductor memory devices are applied in the form of VNAND, a unit cell may be scaled together with a reduction in an operating voltage, and accordingly, research on this approach is being conducted.

SUMMARY

Provided is a memory device having a vertical stack structure capable of securing a stable memory operation.

Provided is a memory device having a vertical stack structure capable of increasing the integration density.

Alternatively or additionally, provided is a method of fabricating the memory device.

Alternatively or additionally, provided is an electronic device including the memory device.

Additional aspects and/or features will be set forth in part in the description which follows and, in part, will be apparent from the description, or may be learned by practice of various example embodiments of the disclosure.

According to some example embodiments, a memory device including a vertical stack structure includes a base substrate, an oxygen scavenger layer on the base substrate, a recording material layer on the oxygen scavenger layer, the recording material layer being in direct contact with the oxygen scavenger layer, a channel layer on the recording material layer, a gate insulating layer on the channel layer, and a gate electrode on the gate insulating layer. The oxygen scavenger layer includes an element that forms oxygen vacancies in the recording material layer and does not include oxygen.

In some examples, the base substrate and the oxygen scavenger layer may include a same material and constitute one layer, e.g. one homogenous layer.

In some examples, the base substrate and the oxygen scavenger layer may be or may include semiconductor layers. Here, the semiconductor layers may be undoped semiconductor layers, or a semiconductor layer doped with a dopant. In the latter case, insulating layers may be provided at both ends of the doped semiconductor layers.

In some examples, the base substrate and the oxygen scavenger layer may be or may include metal layers, and insulating layers may be at both ends of the metal layers.

In some examples, the oxygen scavenger layer may be or may include a semiconductor layer doped with/including a dopant, and insulating layers may be at both ends of the semiconductor layer.

In some examples, the oxygen scavenger layer may include a metal layer, and insulating layers may be at both ends of the metal layer.

In some examples, the element may be a semiconductor element such as a group IV element, and the oxygen scavenger layer may further include nitrogen (N).

In some examples, the oxygen scavenger layer may include a first sub-material layer on the base substrate, and a second sub-material layer on the first sub-material layer and in direct contact with the recording material layer. In some examples, one of the first and second sub-material layers may be or may include a layer including a semiconductor component, and the other one of the first and second sub-material layers may be or may include a metal layer, e.g. a metal layer that does not include the semiconductor component. In some examples, one of the first and second sub-material layers may be a semiconductor layer (e.g. a layer without nitride), and the other one of the first and second sub-material layers may be a nitride layer (e.g. a layer without the semiconductor). One of the first and second sub-material layers may be a semiconductor layer doped with or including a dopant, and the other one of the first and second sub-material layers may be an undoped semiconductor layer. In some examples, the layer including a semiconductor component may include nitrogen.

In some examples, the base substrate may be or may include an insulating structure including oxygen, and the oxygen scavenger layer may be or may include a barrier provided to prevent or reduce the likelihood of and/or impact from movement of oxygen of the base substrate and/or of the native oxide layer to the recording material layer.

In some examples, a plurality of gate electrodes may be aligned on the gate insulating layer in a first direction, and isolation layers may be arranged between the plurality of the gate electrodes and may insulate the plurality of the gate electrodes from each other.

In some examples, the base substrate may have a cylindrical shape parallel to the first direction, and the oxygen scavenger layer, the recording material layer, the channel layer, and the gate insulating layer may be sequentially stacked on a cylindrical surface of the base substrate to surround the base substrate.

In some examples, the base substrate, the oxygen scavenger layer, the recording material layer, the channel layer, the gate insulating layer, the gate electrodes, and the isolation layers may be on a substrate including a doping region, a stack consisting of or including the base substrate, the oxygen scavenger layer, the recording material layer, the channel layer, the gate insulating layer, and the channel layer may be perpendicular to a surface of the substrate with one end of the stack in contact with the doping region, and the gate electrodes and the isolation layers may be in parallel to the substrate and surround the stack. In some examples, the other end of the stack opposite to the one end of the stack may be in contact with a drain region, and a bit line may be connected to the drain region.

In some examples, the recording material layer may include at least one of a variable resistance material and a phase change material.

According to some example embodiments, an electronic device may include the memory device according to various embodiments described above.

According to some example embodiment, a method of fabricating an electronic device includes forming a stack structure by alternately and repeatedly depositing sacrificial layers and isolation layers on a substrate, forming a channel hole penetrating the stack structure, sequentially forming a gate insulating layer, a channel layer, a recording material layer, and an oxygen scavenger layer on an inner surface of the channel hole, filling, with a buried material, an inner space of the channel hole remaining after the oxygen scavenger layer is formed, forming gate holes by removing the sacrificial layers, and depositing an electrode material in the gate holes. The oxygen scavenger layer includes an element that forms oxygen vacancies in the recording material layer and does not include oxygen.

In some examples, the method may further include, after the forming of the gate insulating layer and the channel layer on the inner surface of the channel hole and before the forming of the recording material layer, removing an insulating material and a channel material that are deposited on a bottom surface of the channel hole.

In some examples, the oxygen scavenger layer and the buried material may be formed of a same material, and constitute or correspond to one layer.

In some examples, the forming of the oxygen scavenger layer may include forming a first sub-material layer on an inner surface of the recording material layer, and forming a second sub-material layer on an inner surface of the first sub-material layer.

In some examples, the oxygen scavenger layer may include a semiconductor layer (such as a group-IV layer).

In some examples, the oxygen scavenger layer may include a metal layer, and insulating layers may be at both ends of the metal layer in a direction perpendicular to the substrate.

In some examples, the semiconductor layer may be or may include a silicon layer such as a single-crystal silicon layer or a poly-crystalline silicon layer that is doped with a dopant, or may be or may include an undoped silicon layer, and. When the semiconductor layer is the doped silicon layer, insulating layers may be arranged at both ends of the doped silicon layer in a direction perpendicular to the substrate.

In some examples, one of the first sub-material layer and the second sub-material layer may be or may include a semiconductor layer, and the other one of the first sub-material layer and the second sub-material layer may be or may include a metal layer. In some examples, one of the first sub-material layer and the second sub-material layer may be or may include a semiconductor layer, and the other one of the first sub-material layer and the second sub-material layer may be or may include a nitride layer. In some examples, one of the first sub-material layer and the second sub-material layer may be or may include a doped silicon layer, and the other one of the first sub-material layer and the second sub-material layer may be an undoped silicon layer.

In some examples, the oxygen scavenger layer may be formed by using plasma-enhanced atomic layer deposition (PEALD).

In some examples, the channel layer and the oxygen scavenger layer may be formed of a same material under same conditions, and may be formed at the same time.

According to some example embodiments, an electronic device includes an oxygen scavenger layer, a recording material layer on the oxygen scavenger layer, the recording material layer directly contacting the oxygen scavenger layer, and a channel layer on the recording material layer. The oxygen scavenger layer comprises an element that creates oxygen vacancies in the recording material layer in response to voltages applied to the channel layer, and does not comprise oxygen.

In some example embodiments, the oxygen scavenger layer serves as an insulating substrate.

In some example embodiments, a thickness of the oxygen scavenger layer is between 30 nm and 70 nm.

In some example embodiments, the thickness of the oxygen scavenger layer is about 50 nm.

In some example embodiments, the electronic device comprises a gate electrode layer on the channel layer, and a source electrode on the channel layer. The oxygen scavenger layer is configured to oxygen vacancies in the recording layer in response to a voltage applied to the gate electrode or to the source electrode.

BRIEF DESCRIPTION OF THE DRAWINGS

The above and other aspects, features, and advantages of certain example embodiments will be more apparent from the following description taken in conjunction with the accompanying drawings, in which.

DETAILED DESCRIPTION OF VARIOUS EXAMPLE EMBODIMENTS

Figure 1:
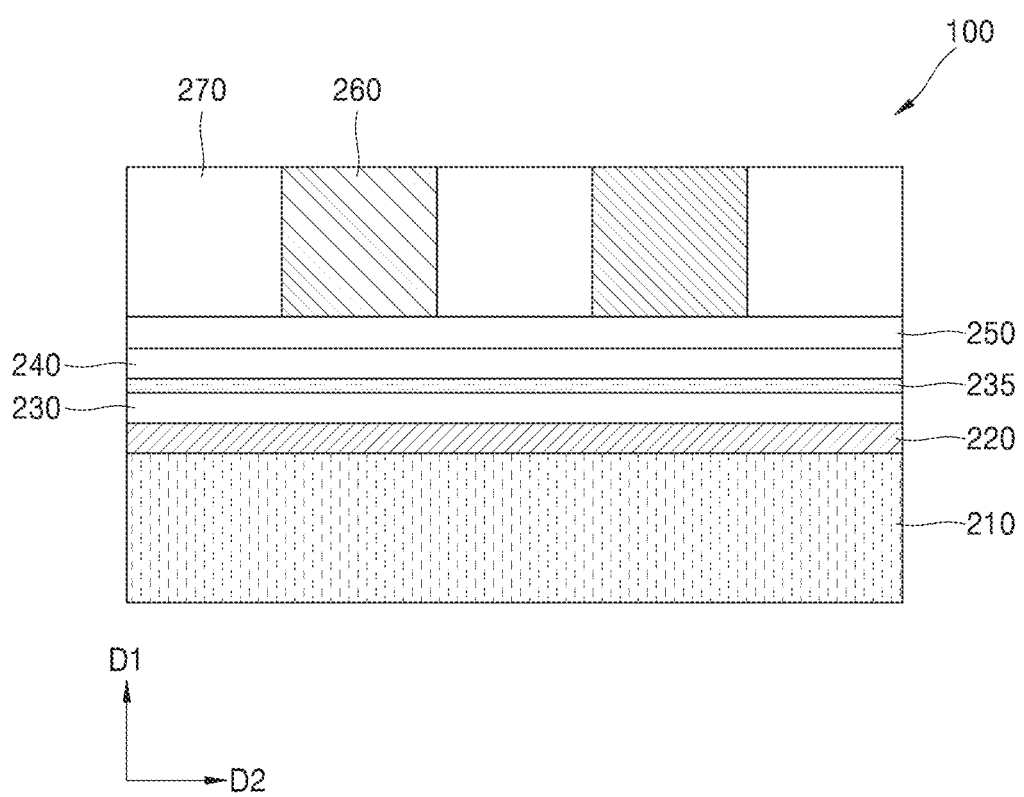
FIGS. 1 to 4 are cross-sectional views each illustrating a schematic structure of a memory device, according to some example embodiments.

Reference will now be made in detail to various embodiments, examples of which are illustrated in the accompanying drawings, wherein like reference numerals refer to like elements throughout. In this regard, various example embodiments may have different forms and should not be construed as being limited to the descriptions set forth herein. Furthermore example embodiments are not necessarily mutually exclusive. For example, some example embodiments may include features described with reference to one or more figures, and may also include features described with reference to one or more other figures. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a memory device having a vertical stack structure, a method of fabricating the same, and an electronic device including a memory device according to various example embodiments will be described in detail with reference to the accompanying drawings. Some example embodiments described below are merely illustrative, and various modifications may be made from these embodiments. In the following drawings, like reference numerals refer to like elements, and sizes of elements in the drawings may be exaggerated for clarity and convenience of description.

Hereinafter, an expression "on" used herein may include not only "immediately on in a contact manner" but also "on in a non-contact manner".

Although the terms such as "first" or "second" may be used herein to describe various elements, these terms are only used to distinguish one element from another element. These terms do not define that the elements have different materials or structures from each other.

The singular expression also includes the plural meaning as long as it is not inconsistent with the context. When an element is referred to as "including" a component, the element may additionally include other components rather than excluding other components as long as there is no particular opposing recitation.

Also, the terms described in the specification, such as " . . . er (or)", " . . . unit", " . . . module", etc., denote a unit that performs at least one function or operation, which may be implemented as hardware or software or a combination thereof.

The term "the" and other demonstratives similar thereto should be understood to include a singular form and plural forms.

The operations of a method may be performed in any suitable order unless otherwise indicated herein or otherwise clearly contradicted by context. In addition, all example terms (e.g., "such as" or "etc.") are used for the purpose of description and are not intended to limit the scope of some example embodiments unless defined by the claims.

FIG. 1 illustrates a first memory device 100, according to some example embodiments.

Referring to FIG. 1, the first memory device 100 includes an insulating structure 210, a first oxygen scavenger layer 220, a recording material layer 230, a channel layer 240, a gate insulating layer 250, which are sequentially formed on the insulating structure 210, gate electrodes 260 (hereinafter, also referred to as the left and right gate electrodes 260) formed on the gate insulating layer 250, and isolation layers 270 on the gate insulating layer 250, with each isolation layer 270 being between two adjacent gate electrodes 260. In some examples, the isolation layers 270 may be provided to cover the entire gate insulating layer 250 between the gate electrodes 260. The first oxygen scavenger layer 220, the recording material layer 230, the channel layer 240, and the gate insulating layer 250 may be sequentially stacked in a first direction D1 and may be parallel to/may extend in a second direction D2. The first direction D1 may be perpendicular or substantially perpendicular to the length direction of the insulating structure 210. The length direction of the insulating structure 210 may be parallel to the second direction D2. The first and second directions D1 and D2 may be perpendicular to each other. In some example embodiments, a native oxide layer 235 may be between the recording material layer 230 and the channel layer 240. The native oxide layer 235 may be or may include a silicon oxide that is naturally formed on the surface of the channel layer 240 containing silicon after the channel layer 240 is formed in a process of fabricating the first memory device 100, e.g. through a native thermal oxidation process. Alternatively or additionally, the native oxide layer 235 may also be formed by an oxidizing agent used in a deposition process of the recording material layer 230 performed after the channel layer 240 is formed. The thickness of the native oxide layer 235 is significantly thinner than (e.g. an order of magnitude or less than) that of other material layers. Accordingly, the native oxide layer 235 may not be illustrated in the accompanying drawings.

The first oxygen scavenger layer 220 may be on one surface of the insulating structure 210 and may cover the entirety of the one surface. The one surface of the insulating structure 210 may be a surface parallel to the second direction D2. The one surface of the insulating structure 210 may be the upper surface of the insulating structure 210 in FIG. 1. However, from another point of view, the one surface of the insulating structure 210 may be a side surface, the bottom surface, or the like rather than the upper surface. The insulating structure 210 may be referred to as simply an insulating layer, a base layer, a base substrate, or the like. In an example, the insulating structure 210 may be an insulating oxide or may include an insulating oxide. In an example, the insulating oxide may include a silicon oxide. In some example embodiments, the silicon oxide may include a $SiO_2$ layer. In some example embodiments, the first oxygen scavenger layer 220 may be a semiconductor layer or may include a semiconductor layer. In some example embodiments, the semiconductor layer may be a layer including a semiconductor having one component. In some example embodiments, the semiconductor layer may be a layer doped with a p-type dopant such as boron and/or an n-type dopant such as at least one of phosphorus or arsenic, or may be an undoped layer. For example, the semiconductor layer may be a doped or undoped single-crystal or polycrystalline silicon (Si) layer or may include such a silicon layer. In some examples, the first oxygen scavenger layer 220 may include a component (element) (e.g., Si) that does not include oxygen, has a relatively high reactivity with oxygen, and thus is capable of forming oxygen vacancies in the recording material layer 230. In some example embodiments, the first oxygen scavenger layer 220 may be formed as an insulating layer including the component described above. For example, the first oxygen scavenger layer 220 may be a silicon nitride layer (e.g., SiN), or may include a silicon nitride layer. In some example embodiments, the first oxygen scavenger layer 220 may be a metal oxide layer, or may include a metal oxide layer. For example, the metal oxide layer may include an $Al_2O_3$ layer and/or a $La_2O_3$ layer. In some example embodiments, in the case where the first oxygen scavenger layer 220 is between the recording material layer 230 and the insulating structure 210 as illustrated in FIG. 1, the thickness of the first oxygen scavenger layer 220 may be, but is not limited to, about 2 nm to about 20 nm.

The recording material layer 230 may cover an entire upper surface of the first oxygen scavenger layer 220 corresponding to the one surface of the insulating structure 210. The recording material layer 230 and a corresponding surface (e.g., the surface facing the recording material layer 230) of the first oxygen scavenger layer 220 may be in contact with/direct contact with each other. While the first memory device 100 operates, e.g. is electrically active, a portion of oxygen, such as some oxygen atoms, included in the recording material layer 230 may be moved to the first oxygen scavenger layer 220 through the contact. Such oxygen migration may be caused by bonding of a component (e.g., Si) included in the first oxygen scavenger layer 220 with oxygen of the recording material layer 230.

As a result, as the recording material layer 230 and the first oxygen scavenger layer 220 are configured to be in contact/direct contact with each other, oxygen vacancies in the recording material layer 230 may be more easily formed than when the first oxygen scavenger layer 220 is not provided. For example, as the first oxygen scavenger layer 220 is provided, a conductive filament may be easily formed in a variably defined or predefined area of the recording material layer 230 in the operation of the first memory device 100.

The recording material layer 230 is or includes a layer in which resistance is changed and/or switched according to an applied voltage environment. Therefore, the recording material layer 230 may also be referred to as a resistive change layer or a resistive switching (RS) layer.

Considering the above-described action of the first oxygen scavenger layer 220, the first oxygen scavenger layer 220 may also be referred to as an oxygen vacancy forming layer. Alternatively or additionally, as the first oxygen scavenger layer 220 is provided, the amount of oxygen vacancies of the recording material layer 230 increases, and thus the first oxygen scavenger layer 220 may be referred to as a layer that increases the amount of oxygen vacancies (an oxygen vacancy increasing layer) and/or a layer that increases the concentration of oxygen vacancy (an oxygen vacancy concentration increasing layer).

The recording material layer 230 has a resistance change characteristic by which resistance changes in a certain area, according to or based on an external voltage environment, thus the recording material layer 230 may be used as a layer in which bit data such as logical '1' or '0' is recorded, and the resistance change characteristic is relevant to the formation of oxygen vacancies in the recording material layer 230. For example, in order for the resistance of the recording material layer 230 to smoothly change, it may be necessary or desirable to cause oxygen vacancies to be easily or more easily formed in the recording material layer 230. As the first oxygen scavenger layer 220 is provided, oxygen vacancies are easily or more easily formed in the recording material layer 230, and thus the resistance of the recording material layer 230 may smoothly change. In this regard, the first oxygen scavenger layer 220 may be regarded as a layer that serves to normally maintain the resistance change characteristic of the recording material layer 230. Alternatively or additionally, because the recording material layer 230 is a layer in which bit data is recorded, the operation of the first memory device 100 including the first oxygen scavenger layer 220 may be more stable and/or the reliability thereof may be further improved.

The recording material layer 230 may include a variable resistance material. The variable resistance material is a material in which oxygen vacancies are formed by the behaviour of oxygen therein according to an applied voltage, and as a result, a conductive filament is or may be formed. Depending on whether a conductive filament is formed, the variable resistance material may exhibit a low-resistance state or a high-resistance state, and such resistance states may represent a recording of bit data as logical '1' or '0'.

In some examples, the variable resistance material may be any one or more of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Sc_2O_3$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, and $MnO_2$. Alternatively or additionally, the recording material layer 230 may have a structure in which two or more of the variable resistance materials described above are formed in a plurality of layers.

In some example embodiments, the recording material layer 230 may include a phase change material. The phase change material is a material that exhibits high resistance in an amorphous state and low resistance in a crystalline state. Such phase change may be caused by Joule heating that occurs when an electrical pulse is applied. The phase change material may have bit data as logical '1' or '0' according to the phase thereof. In some examples, $GST(Ge_2Sb_2Te_5)$ may be used as the phase change material, and various chalcogenide materials such as $Ga_2Sb_2Te_5$, InSbTe, GeSeTe, and the like may be used as the phase change material.

Hereinafter, an example in which a variable resistance material is employed as the recording material layer 230 will be described, but the recording material layer 230 is not limited thereto.

The thickness of the recording material layer 230 may be about 0.5 nm to about 30 nm. In some examples, the thickness of the recording material layer 230 may be about 0.5 nm to about 20 nm.

Figure 6:
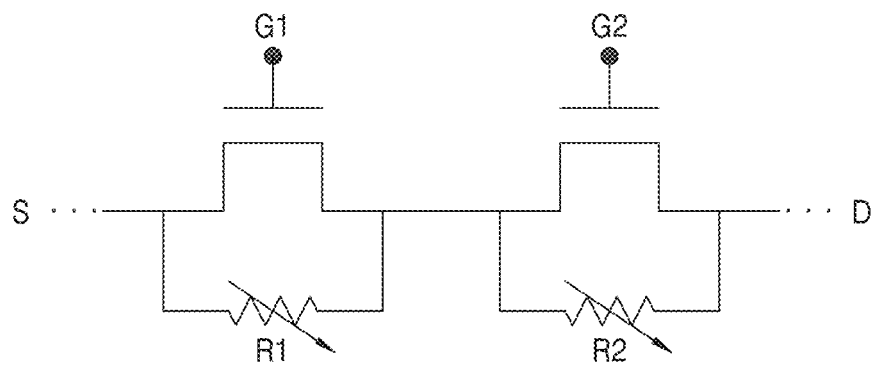
FIG. 6 illustrates an equivalent circuit of the memory devices of FIGS. 1 to 4.

In some examples, the channel layer 240 may be formed of a semiconductor material, and may include, for example, polysilicon (poly-Si). The channel layer 240 may be doped with a certain dopant, for example, a p-type dopant such as boron, but example embodiments are not limited thereto. The channel layer 240 may include, for example, one or more of Ge, IGZO, or GaAs. A source electrode S and a drain electrode D, as illustrated in FIG. 6, may be connected to both ends of the channel layer 240, respectively.

Referring back to FIG. 1, the plurality of isolation layers 270 and the gate electrodes 260 may be alternately arranged on the gate insulating layer 250 in the second direction D2. For example, the plurality of isolation layers 270 are arranged on the gate insulating layer 250 in the second direction D2, and one gate electrode 260 is positioned between two separation layers 270. One memory cell requires one gate electrode 260. Accordingly, as many gate electrodes 260 as the desired number of memory cells may be provided. In some examples, the length of the gate electrode 260 in the second direction D2 may be about 5 nm to about 30 nm. In an example, the length of the isolation layer 270 in the second direction D2 may be about 5 nm to about 30 nm. In an example, from the gate insulating layer 250, the height of the gate electrode 260 and the height of the isolation layer 270 may be identical to each other. Areas of the recording material layer 230, which face the gate electrodes 260, may be switching areas in which resistance may be changed according to an applied voltage environment.

In an example, the gate insulating layer 250 may be formed of/may include various insulating materials such as silicon oxide, silicon nitride, or silicon oxynitride. In an example, a voltage for turning on/off the channel layer 240 may be selectively applied to the gate electrodes 260.

Figure 2:
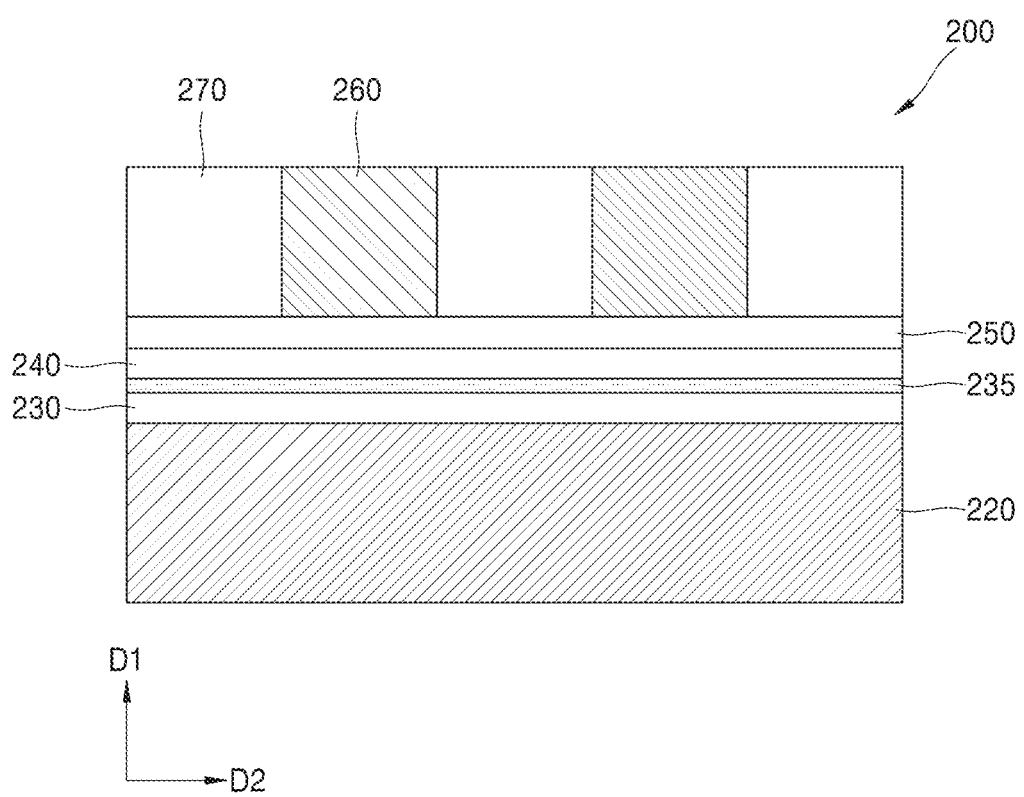

FIG. 2 illustrates a second memory device 200, according to some example embodiments. Only descriptions different from those provided with reference to in FIG. 1 will be provided.

Referring to FIG. 2, the second memory device 200 includes the first oxygen scavenger layer 220, the recording material layer 230, the channel layer 240, and the gate insulating layer 250, which are sequentially stacked below the isolation layers 270 and the gate electrodes 260. The second memory device 200 does not include the insulating structure 210 of the first memory device 100. In the second memory device 200, the first oxygen scavenger layer 220 may serve or act both as an oxygen scavenger and the insulating structure 210/base substrate of the first memory device 100. Accordingly, in the second memory device 200, the thickness of the first oxygen scavenger layer 220 may be greater than the thickness of the first oxygen scavenger layer 220 of the first memory device 100. In FIG. 2, the thickness of the first oxygen scavenger layer 220 may be between 30 nm and 70 nm, e.g. about 50 nm, but example embodiments are not limited thereto, and may be adjusted if necessary.

Figure 3:
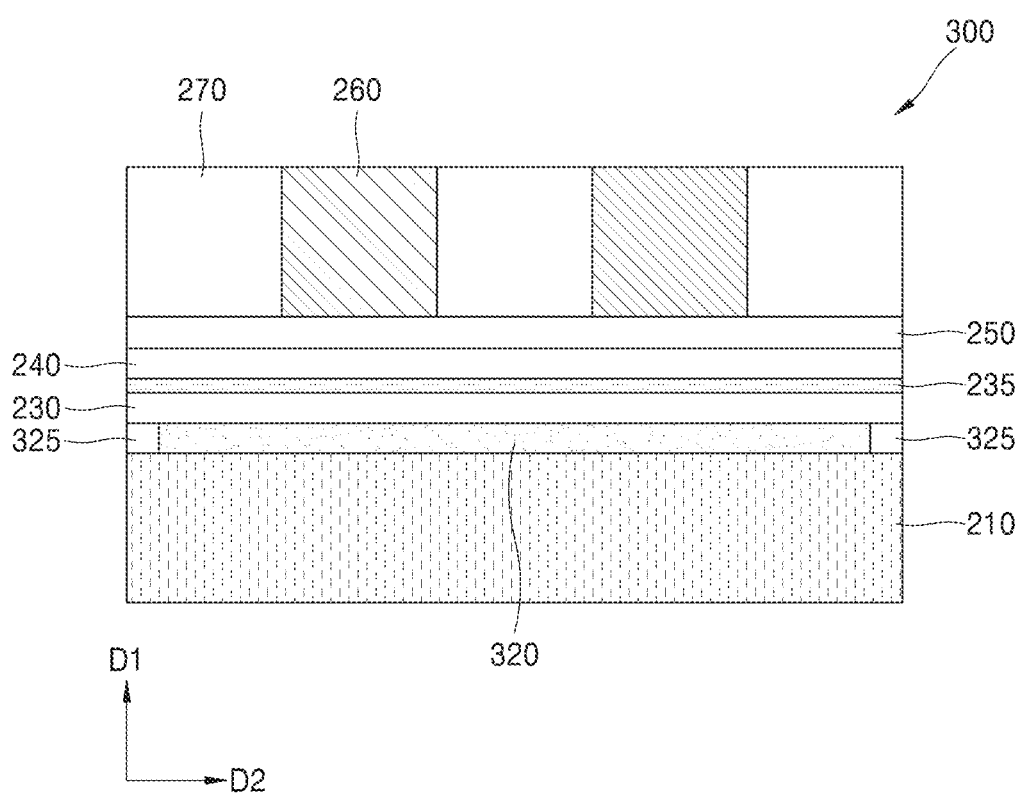

FIG. 3 illustrates a third memory device 300, according to some example embodiments. Only descriptions different from those provided with reference to in FIG. 1 will be provided.

Referring to FIG. 3, a second oxygen scavenger layer 320 is provided between the insulating structure 210 and the recording material layer 230. For example, the third memory device 300 may include the insulating structure 210, the second oxygen scavenger layer 320, the recording material layer 230, the native oxide layer 235, the channel layer 240, and the gate insulating layer 250, which are sequentially stacked. In the third memory device 300, the arrangement relationship between the second oxygen scavenger layer 320 and the other material layers 210, 230, 235, 240, and 250 may be the same as the arrangement relationship between the first oxygen scavenger layer 220 and the other material layers 210, 230, 235, 240, and 250 in the first memory device 100. However, the length of the second oxygen scavenger layer 320 in the second direction D2 in the third memory device 300 may be less than the length of the first oxygen scavenger layer 220 in the second direction D2 in the first memory device 100. Insulating layers 325 are provided at both sides of the second oxygen scavenger layer 320 in the second direction D2, respectively. Accordingly, as illustrated in an equivalent circuit of FIG. 6, it is possible to prevent or reduce the likelihood of the source electrode S and the drain electrode D from being in direct contact with the second oxygen scavenger layer 320. In an example, the second oxygen scavenger layer 320 may be a metal layer, or may include a metal layer.

Figure 4:
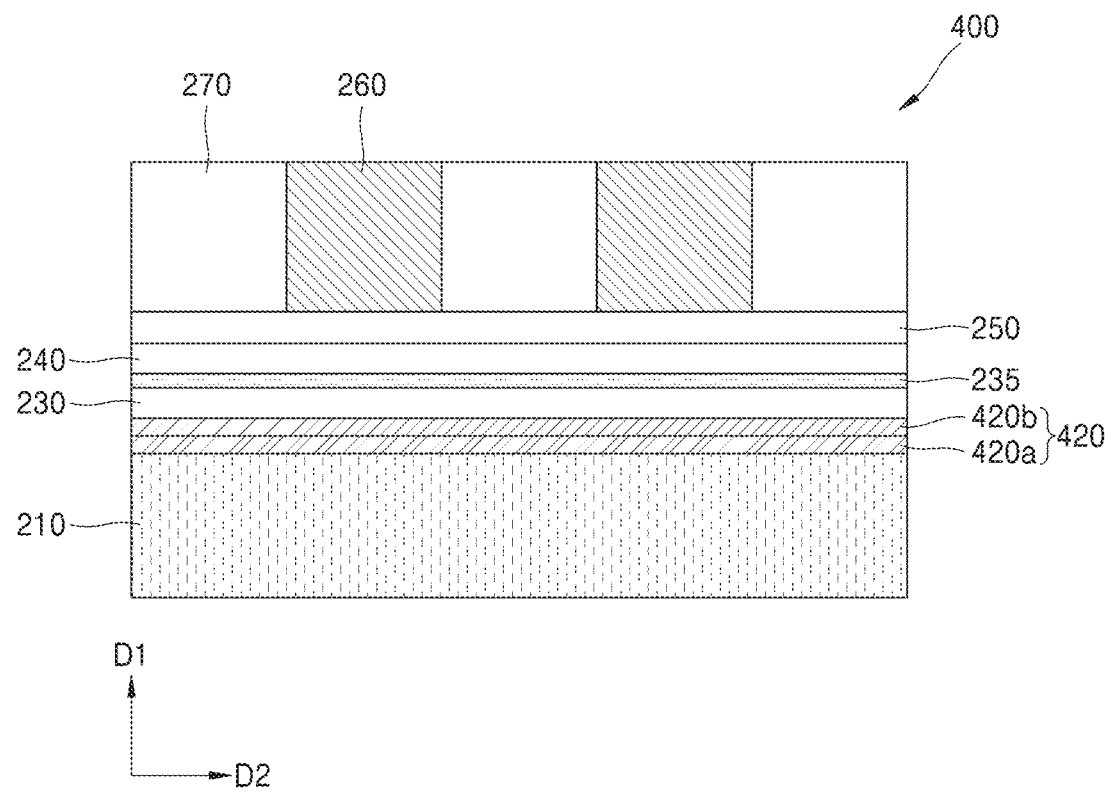

FIG. 4 illustrates a fourth memory device 400, according to some example embodiments. Only descriptions different from those provided with reference to in FIG. 1 will be provided.

Referring to FIG. 4, the fourth memory device 400 may include a third oxygen scavenger layer 420 between the insulating structure 210 and the recording material layer 230. The third oxygen scavenger layer 420 includes first and second sub-material layers 420a and 420b sequentially stacked on the insulating structure 210 in the first direction D1. The third oxygen scavenger layer 420 may be a non-oxide layer, or may include a non-oxide layer. In an example, the third oxygen scavenger layer 420 may be a semiconductor layer or may include a semiconductor layer, and the semiconductor layer may be a pure semiconductor layer or a semiconductor layer doped with a dopant. In an example, one of the first and second sub-material layers 420a and 420b may be a layer doped with a dopant, and the other may be an undoped layer. In an example, one of the first and second sub-material layers 420a and 420b may be an undoped silicon layer, and the other may be a silicon layer doped with a p-type or n-type dopant, but they are not limited thereto. In an example, the third oxygen scavenger layer 420 may be formed as an insulating layer including a component (e.g., Si) that does not include oxygen and has a relatively high reactivity with oxygen. For example, the third oxygen scavenger layer 420 may be a silicon nitride layer (e.g., SiN), or may include a silicon nitride layer. In an example, one of the first and second sub-material layers 420a and 420b may be a doped or undoped silicon layer, and the other may be a silicon nitride layer. In an example, the third oxygen scavenger layer 420 may be a metal oxide layer, or may include a metal oxide layer. For example, the metal oxide layer may include an $Al_2O_3$ layer or a $La_2O_3$ layer. In an example, one of the first and second sub-material layers 420a and 420b may be one selected from the group consisting of or including a doped silicon layer, an undoped silicon layer, a silicon nitride layer, and a metal oxide layer, and the other may be another selected from the above group.

Although the third oxygen scavenger layer 420 is illustrated as including two sub-material layers 420a and 420b, some example embodiments is not limited thereto. For example, the third oxygen scavenger layer 420 include two or more sub-material layers.

The first to fourth memory devices 100, 200, 300 and 400 may have a structure in which a plurality of memory cells are arrayed, and, as shown in FIG. 6, may have a configuration in which transistors and variable resistors R1 and R2 are connected in parallel to each other. The resistances of the variable resistors R1 and R2 may be set by voltages applied to the gate electrodes G1 and G2, respectively, and a voltage between the source electrode S and the drain electrode D, and may be a value corresponding to information of 1 or 0.

Figure 5:
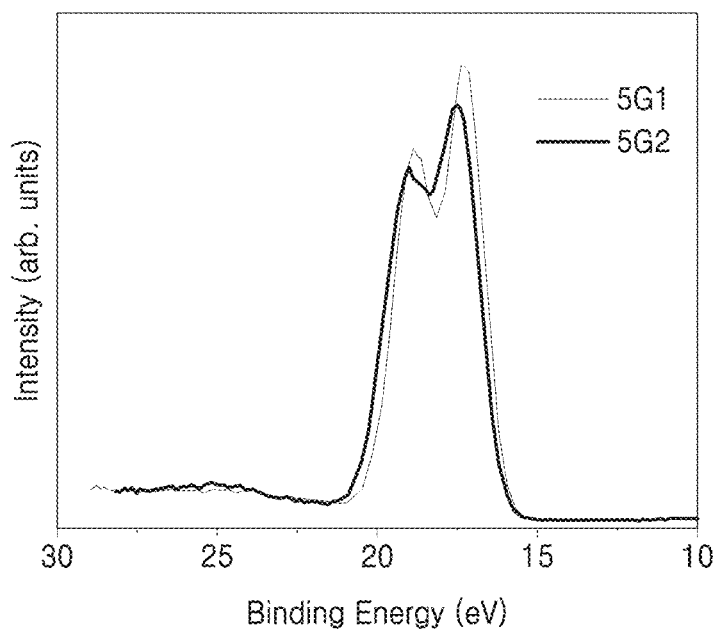
FIG. 5 is a graph showing an oxygen vacancy formation characteristic according to a contact material of a recording material layer included in a memory device, according to some example embodiments.

FIG. 5 shows a result of an X-ray photoelectron spectroscopy (XPS) experiment for verifying whether oxygen vacancies are formed in the recording material layer 230 of the memory device according to some example embodiments.

In the experiment for obtaining the result of FIG. 5, a doped silicon layer (a heavily doped p++ silicon substrate) was used as the oxygen scavenger layer 220, and $HfO_2$ was used as the recording material layer 230.

The experiment was performed on a first sample (an experimental memory device) in which the oxygen scavenger layer 220 is in direct contact with the recording material layer 230, and a second sample (a comparative memory device) in which a silicon oxide ($SiO_2$) is provided between the oxygen scavenger layer 220 and the recording material layer 230 to be in direct contact with the oxygen scavenger layer 220. The second sample may correspond to an existing memory device in which the insulating structure ($SiO_2$) 210 and the recording material layer ($HfO_2$) 230 are in direct contact with each other.

In FIG. 5, the horizontal axis represents binding energy, and the vertical axis represents the intensity of photoelectrons emitted from the sample by X-ray irradiation.

In FIG. 5, a first graph 5G1 shows the result for the first sample, and a second graph 5G2 shows the result for the second sample.

Comparing the first and second graphs 5G1 and 5G2 of FIG. 5 with each other, in the case where the recording material layer ($HfO_2$) 230 is in contact with the doped silicon layer (the oxygen scavenger layer 220) (shown by 5G1), the Hf 4f peak is shifted toward relatively low binding energy compared to the case where the recording material layer ($HfO_2$) 230 is in contact with silicon oxide ($SiO_2$) (shown by 5G2).

This result suggests that oxygen vacancies are formed in the recording material layer 230 as the oxygen scavenger layer 220 is in direct contact with the recording material layer 230, and that the oxygen scavenger layer 220 in contact with the recording material layer 230 literally acts as an oxygen scavenger with respect to the recording material layer 230.

In addition, it may be seen that the Hf 4f peak of the second graph 5G2 is shifted toward high binding energy compared to the first graph 5G1, and this suggests that, because the recording material layer 230 is in direct contact with silicon oxide ($SiO_2$), oxygen is moved from the silicon oxide ($SiO_2$) to the recording material layer ($HfO_2$) 230, and thus the oxygen vacancies in the recording material layer ($HfO_2$) 230 are reduced. For example, this result suggests that the oxidation number of hafnium (Hf) in the recording material layer ($HfO_2$) 230 is increased.

In the memory devices 100, 300, and 400 of FIGS. 1, 3, and 4, an example of the insulating structure 210 includes a silicon oxide ($SiO_2$) containing oxygen. Therefore, the oxygen scavenger layer 220, which is arranged between the insulating structure 210 and the recording material layer 230 to prevent or reduce the likelihood of and/or impact from the insulating structure 210 and the recording material layer 230 from coming into direct contact with each other, consequently serves as a barrier to prevent or reduce oxygen from moving from the insulating structure 210 to the recording material layer 230.

Figure 7:
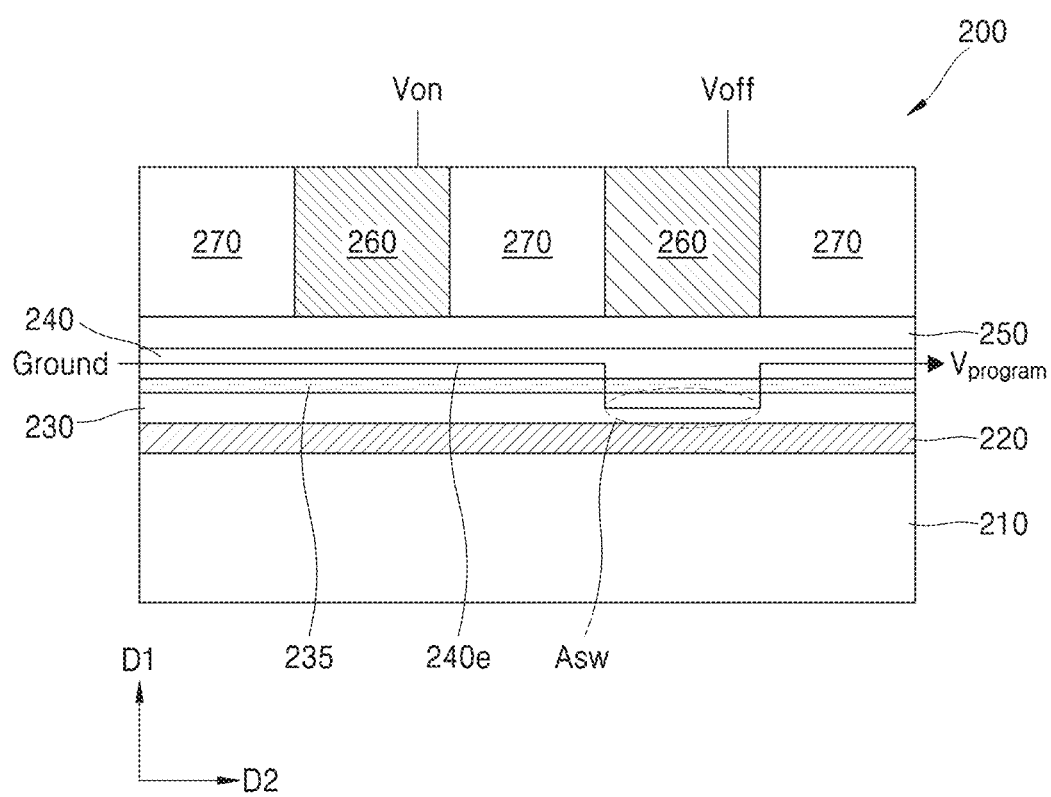
FIGS. 7 to 9 are diagrams for describing write, read, and erase operations performed in the memory device of FIG. 1.
Figure 8:
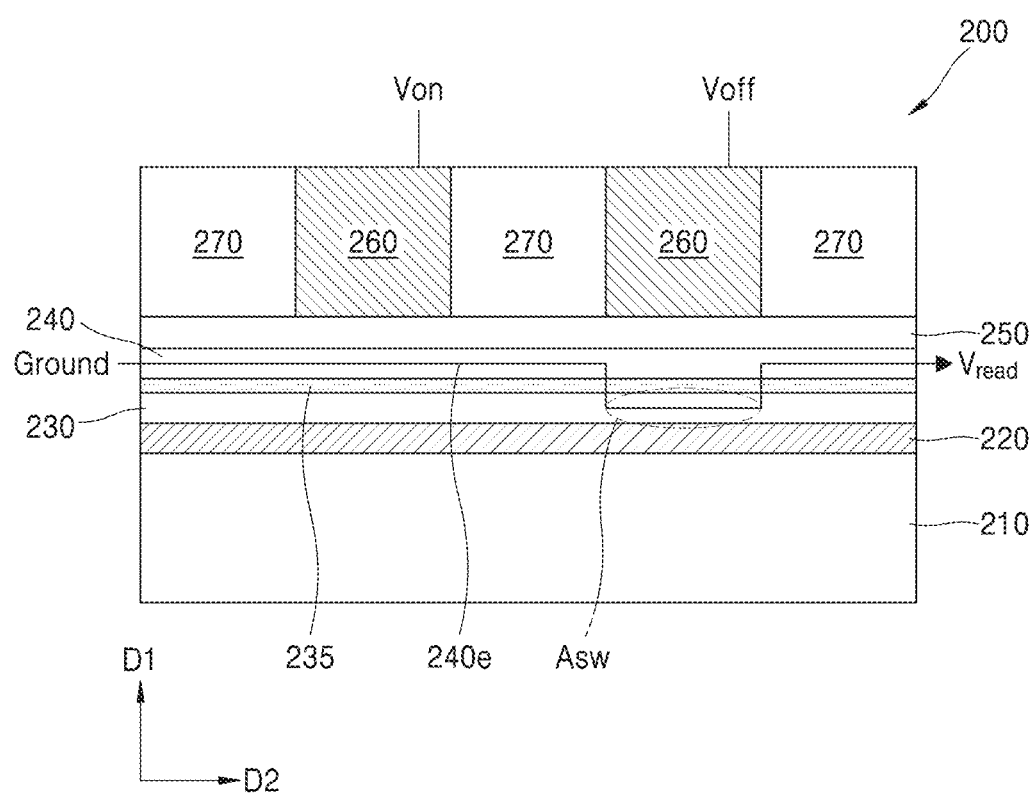
Figure 9:
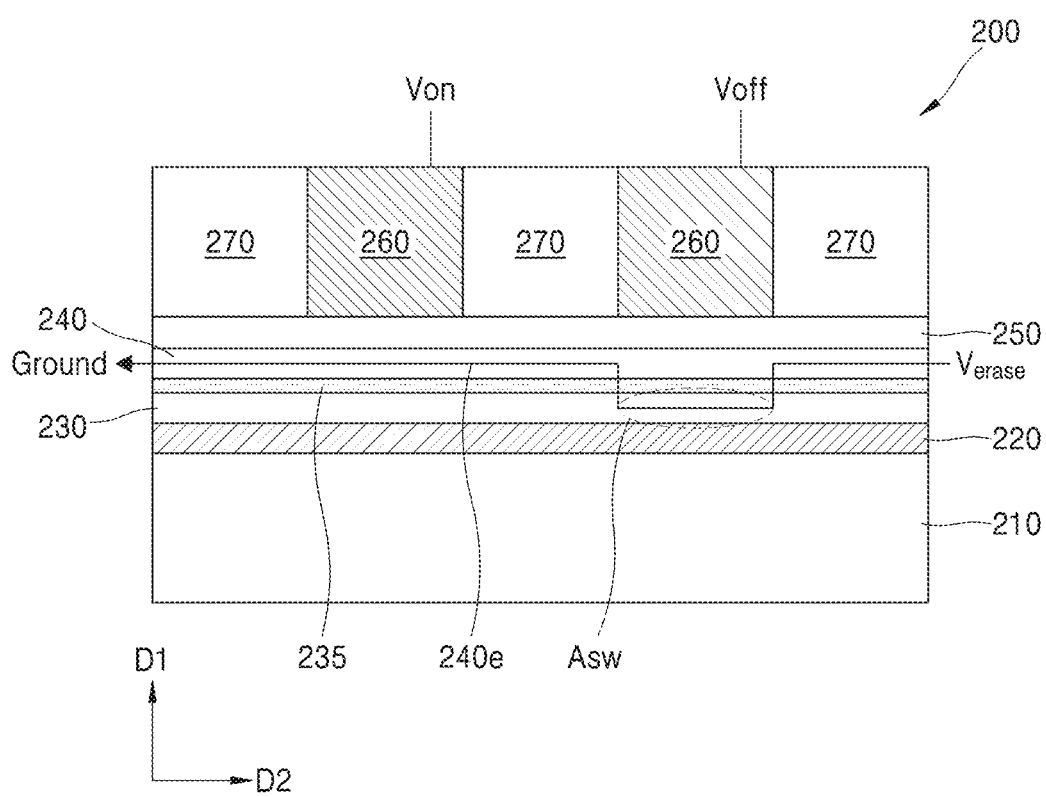

FIGS. 7 to 9 show write, read, and erase operations of the first to fourth memory devices 100, 200, 300, and 400 of FIGS. 1 to 4.

FIG. 7 illustrates that the left memory cell is not selected as a write cell and the right memory cell is selected as a write cell. Accordingly, a gate voltage $V_{on}$ for channel-ON is applied to the left gate electrode 260, and a gate voltage $V_{off}$ for channel-OFF is applied to the right gate electrode 260. When a write voltage $V_{program}$ is applied across the channel layer 240, a current 240e flows along the channel layer 240 in the (left) memory cell in the channel-ON state, whereas the current does not flow along the channel layer 240 in the (right) memory cell in the channel-OFF state. In this case, a high voltage is applied across an area of the channel layer 240 where the current does not flow, and the resistance state of the recording material layer 230 is changed to a low-resistive state (LRS) under the influence of an electric field by the high voltage. In this way, the write operation is completed. This resistance state change means that bit data 1 or 0 has been written to the selected memory cell. In other words, the resistance state of a switching area $A_{sw}$ of the recording material layer 230 corresponding to the right gate electrode 260 is switched by the high voltage applied across the area of the channel layer 240 where the current does not flow, and thus information is recorded.

As a result, in FIG. 7, in the selected memory cell (i.e., the memory cell in the channel-OFF state), the current does not flow through the channel layer 240 but flows through the recording material layer 230.

Referring to FIG. 8, the left cell is an unselected cell, and the voltage $V_{on}$ for channel-ON is applied to the gate electrode 260, whereas the right cell is a selected cell, and the voltage $V_{off}$ for channel-OFF is applied to the gate electrode 260. For a read operation, a read voltage $V_{read}$, which does not change the resistance state of the switching area $A_{sw}$, is applied across the channel layer 240. In the right cell in the channel-off state, the current does not flow through the channel layer 240 but flows through the recording material layer 230, and the resistance state of the corresponding cell may be read by measuring the current. For example, the bit data written in the corresponding cell may be read.

Referring to FIG. 9, in order to erase the information written in the right cell, an erase voltage $V_{erase}$ is applied such that the current flows in a direction opposite to that in the write operation. The left cell is an unselected cell, and the voltage $V_{on}$ for channel-ON is applied to the gate electrode 260, whereas the right cell is a selected cell, and the voltage $V_{off}$ for channel-OFF is applied to the gate electrode 260. In the right cell in the channel-off state, the current does not flow through the channel layer 240, but flows through the recording material layer 230 in the direction opposite to that in the write operation, and the resistance state of the switching area $A_{sw}$ is switched. For example, when the erase voltage $V_{erase}$ is applied, the resistance state of the switching area $A_{sw}$ is restored to its original state before the information is written.

Figure 13:
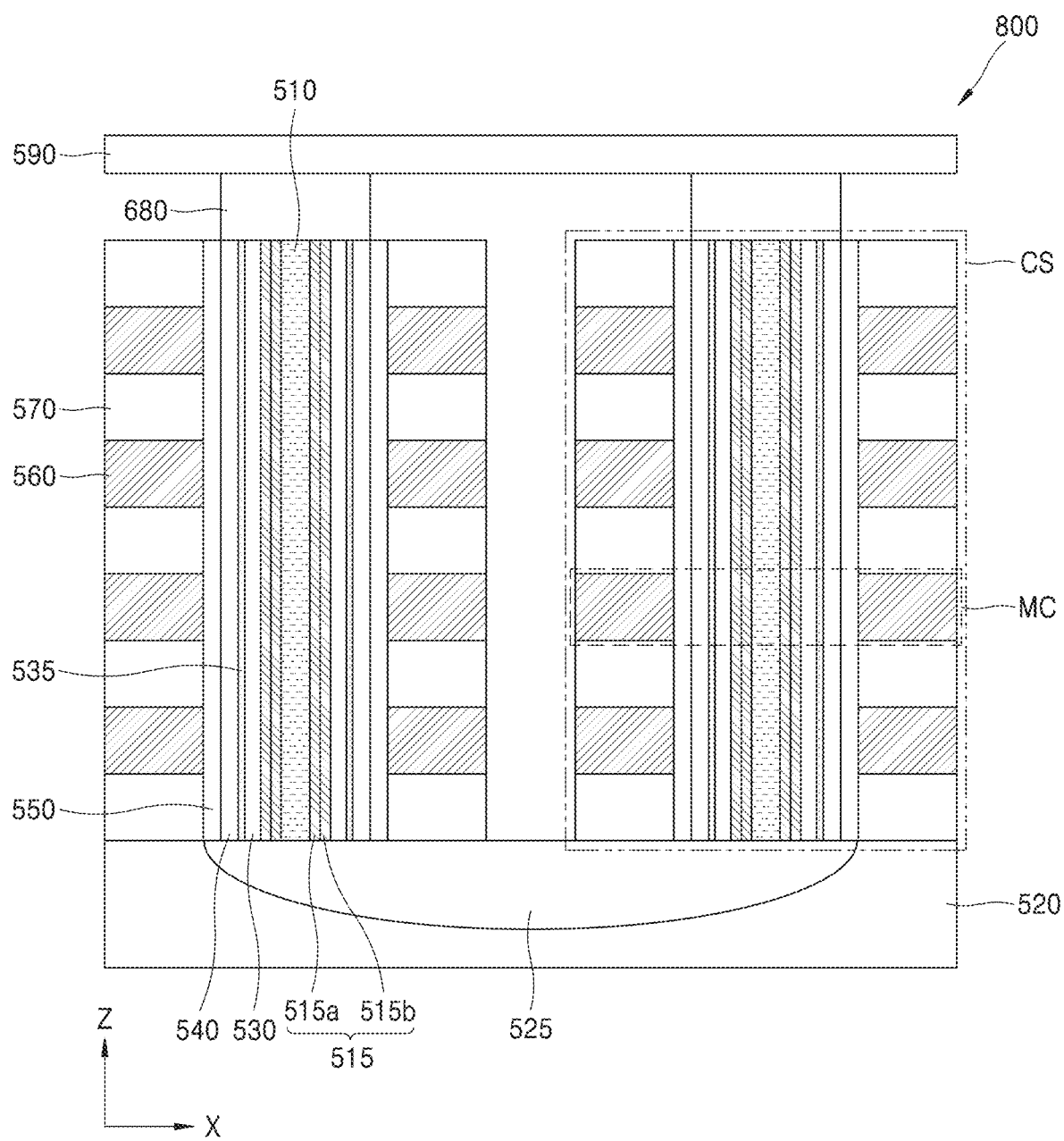
Figure 14:
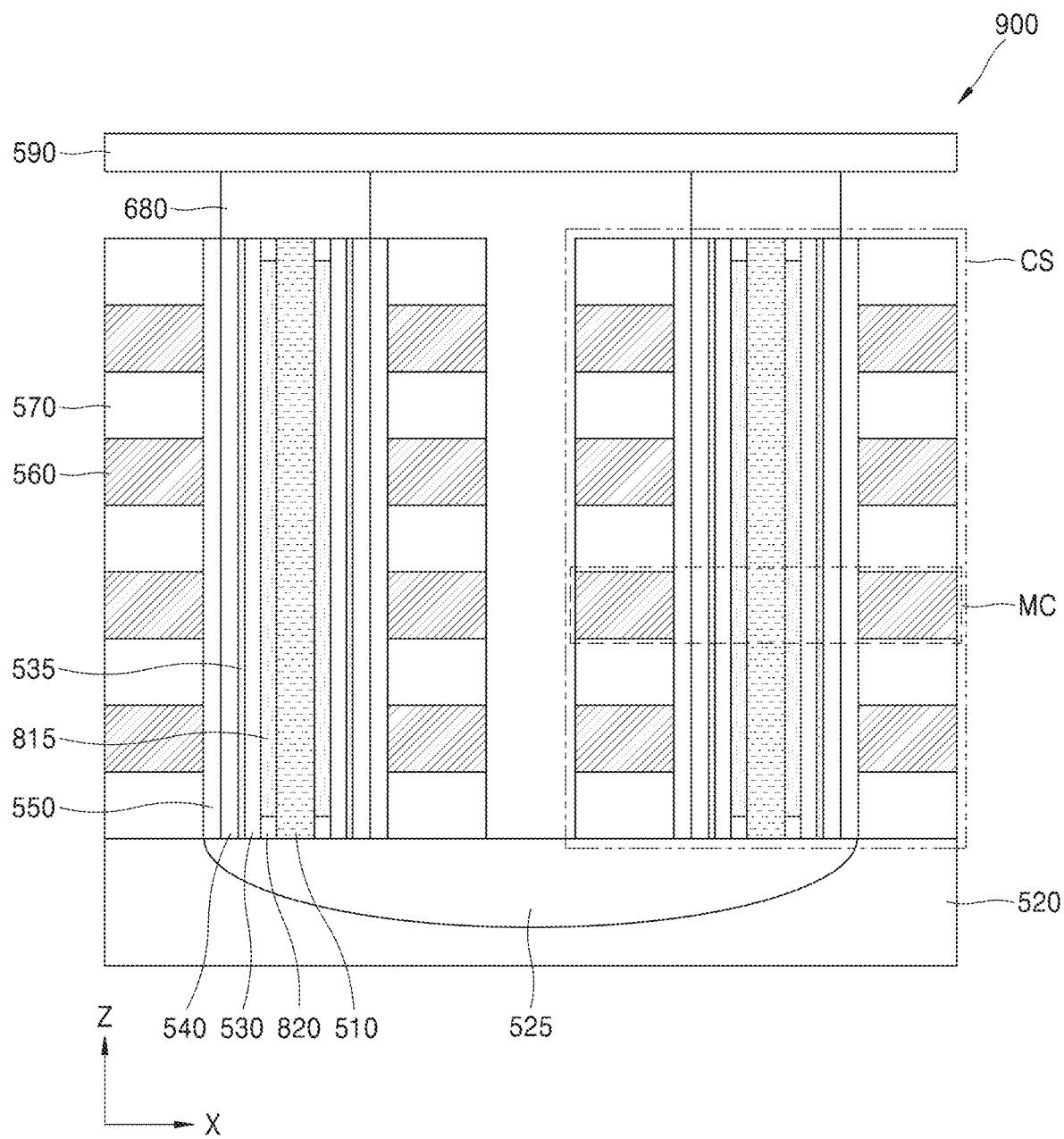
Figure 15:
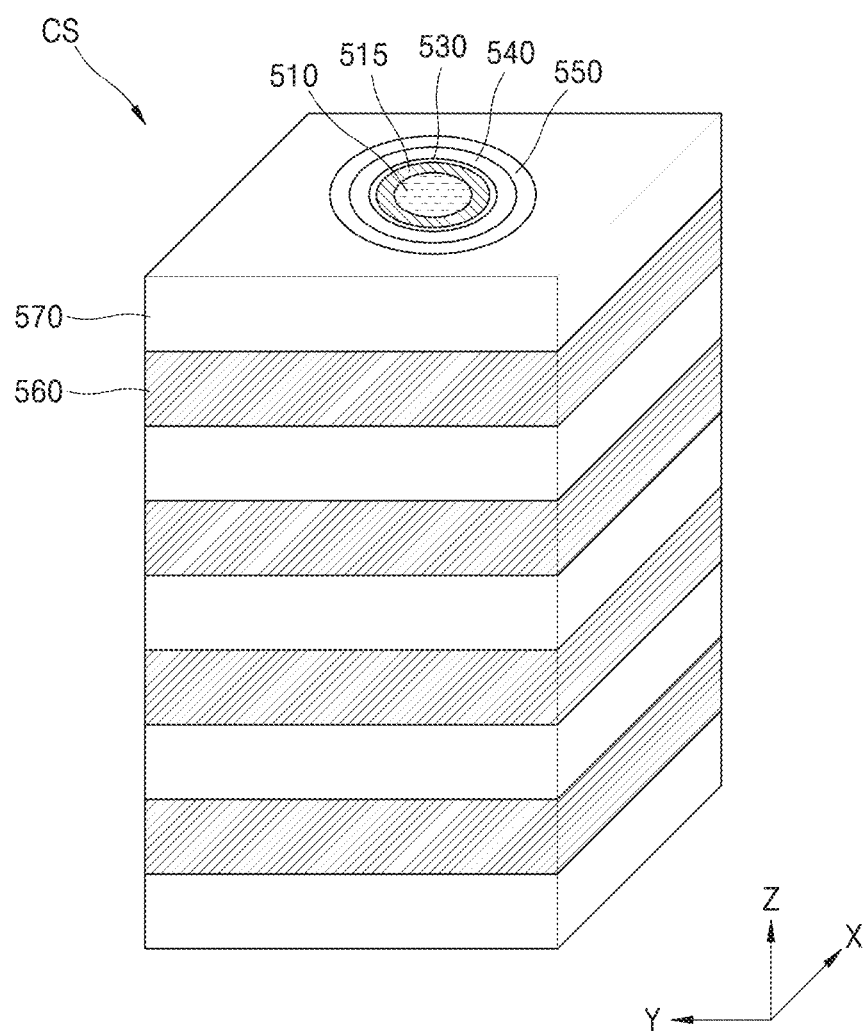
FIG. 15 is a perspective view illustrating a schematic structure of a memory string provided in the memory device of FIG. 10.
Figure 16:
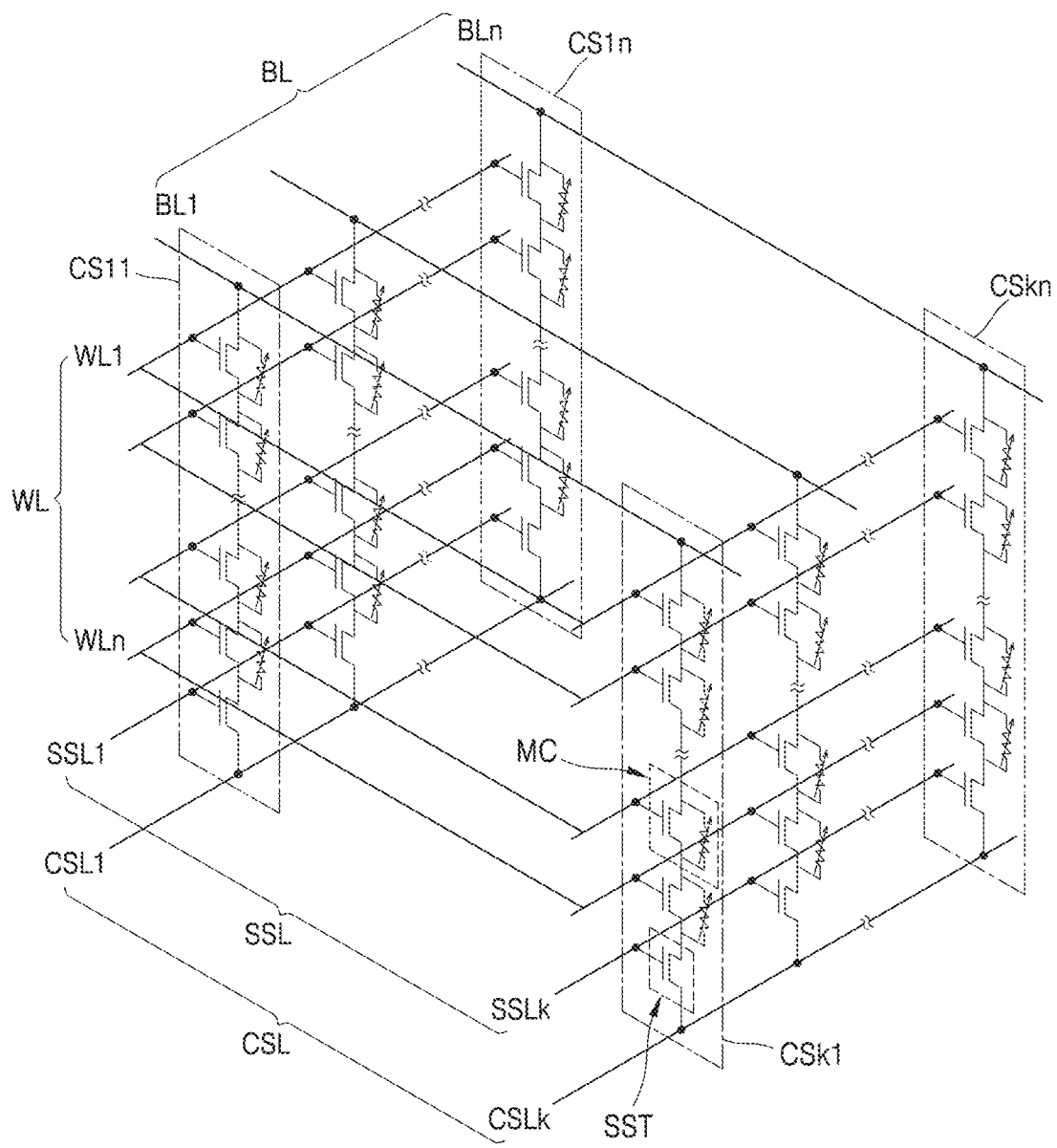
FIG. 16 is an equivalent circuit diagram of the memory devices of FIGS. 10 to 14.

FIGS. 10 to 14 show schematic structures of fifth to ninth memory devices 500, 600, 700, 800, and 900, according to another embodiment, and FIG. 15 stereoscopically shows a schematic structure of a memory string provided in the fifth to ninth memory devices 500, 600, 700, 800, and 900 of FIGS. 10 to 14. FIG. 16 is an equivalent circuit diagram of the memory devices 500, 600, 700, 800, and 900 of FIGS. 10 to 14.

The fifth to ninth memory devices 500, 600, 700, 800, and 900 illustrated in FIGS. 10 to 14 are vertical NAND (VNAND) memories in which a plurality of memory cells MC are vertically arrayed. The fifth to ninth memory devices 500, 600, 700, 800, and 900 may be Pc-VNAND using a phase change material or Re-VNAND using a variable resistance material.

The fifth to ninth memory devices 500, 600, 700, 800, and 900 may have the same structure except for stacks within their recording material layers 530.

Figure 10:
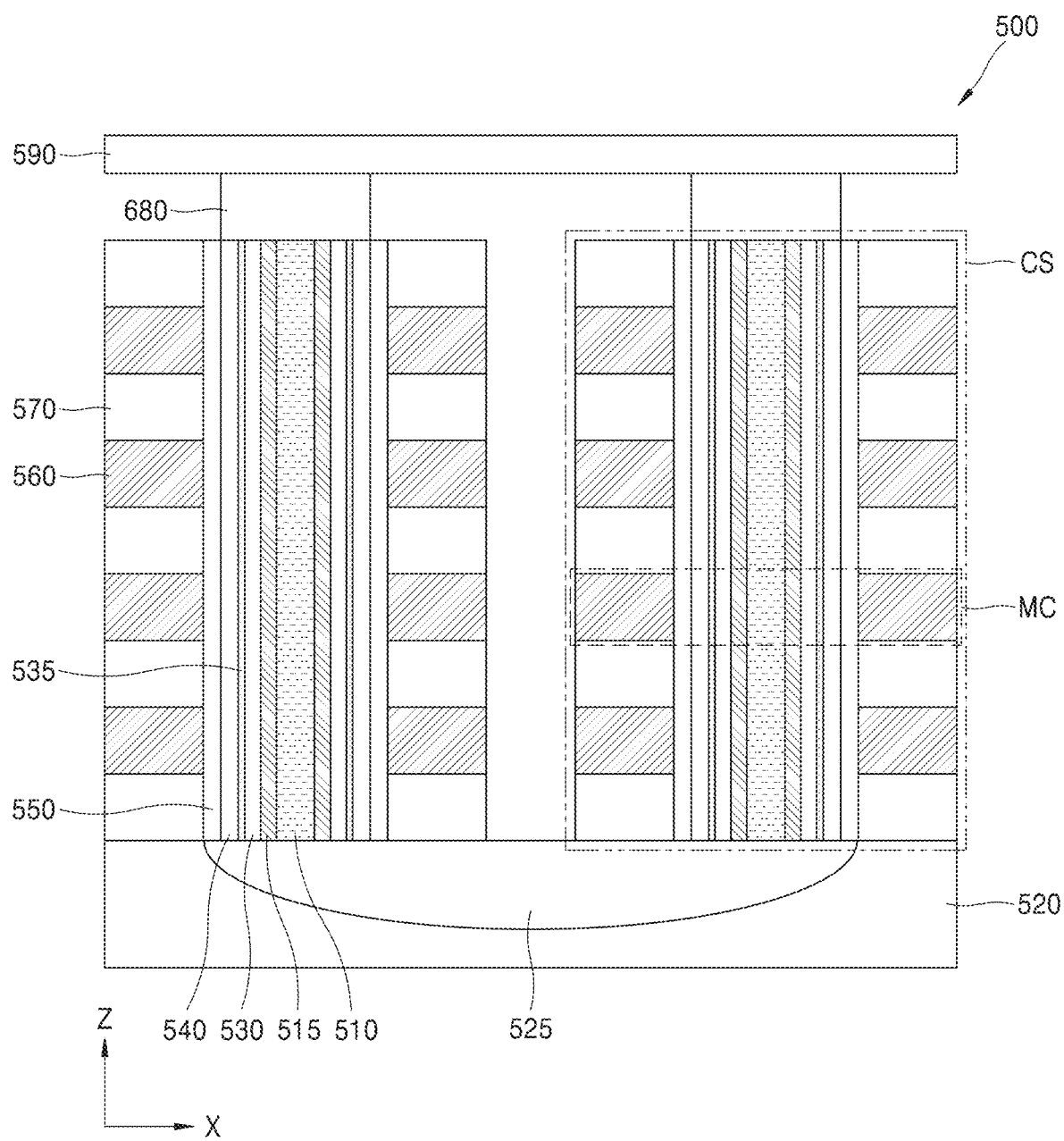
FIGS. 10 to 14 are cross-sectional views each illustrating a schematic configuration of a memory device, according to some example embodiments.

In detail, as illustrated in FIG. 10, the fifth memory device 500 includes an insulating structure 510 and an oxygen scavenger layer 515 sequentially stacked inside the recording material layer 530 in a direction parallel to a substrate 520 (i.e., the X-axis direction).

Figure 11:
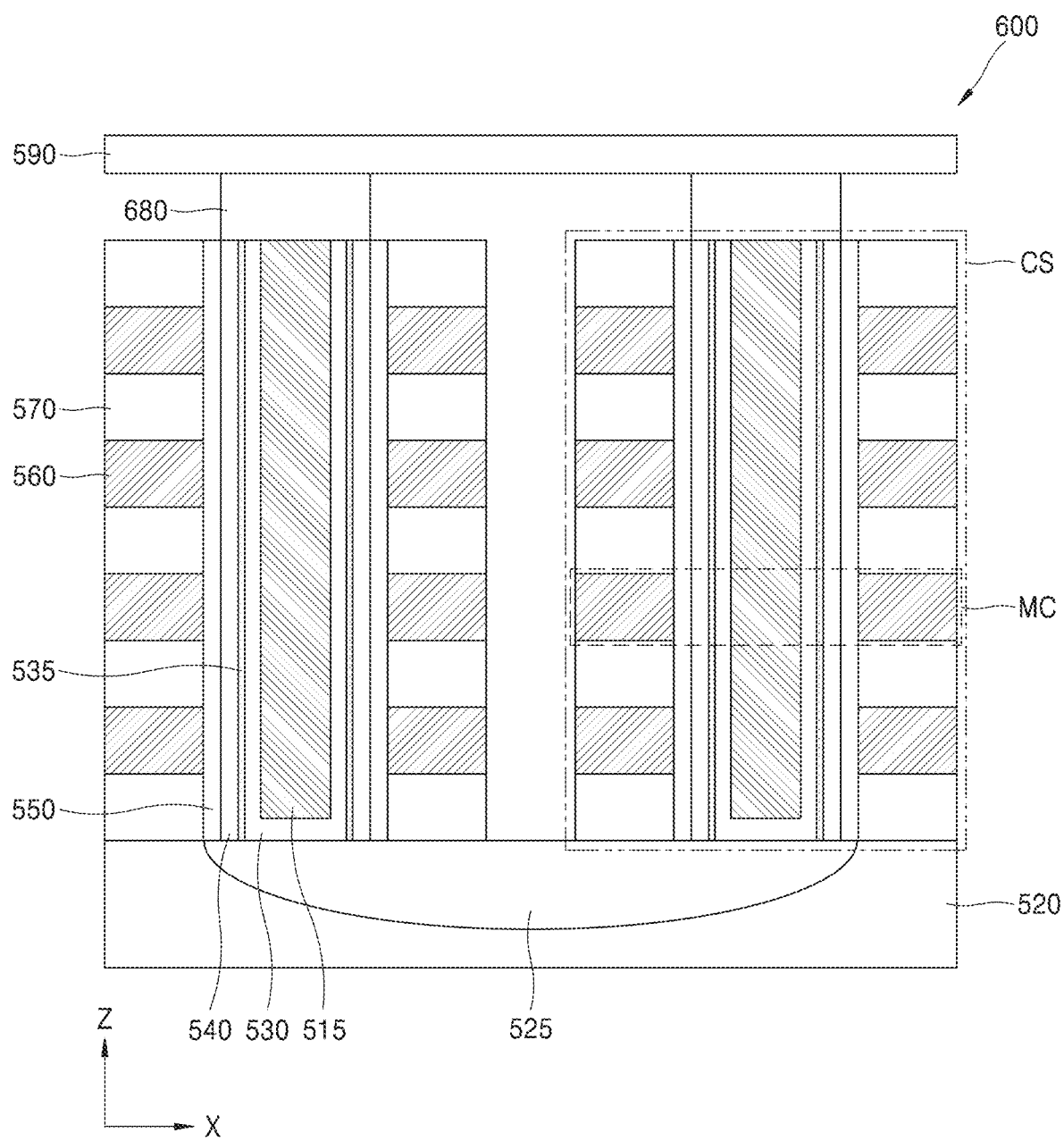

As illustrated in FIG. 11, in the sixth memory device 600, the inside of the recording material layer 530 is filled only with the oxygen scavenger layer 515. In the sixth memory device 600, the oxygen scavenger layer 515 may be an undoped semiconductor layer (e.g., a Si layer).

Figure 12:
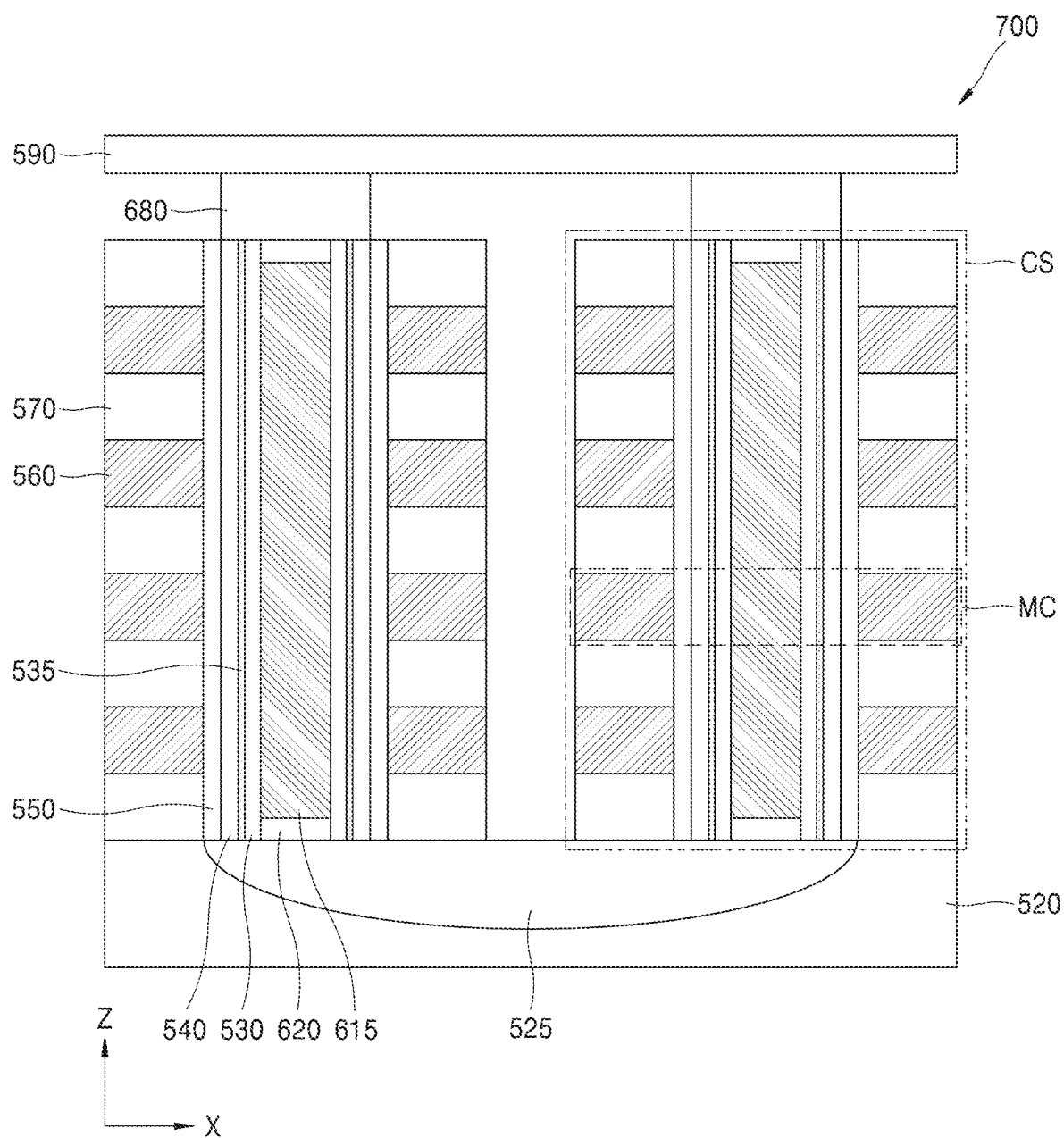

As illustrated in FIG. 12, in the seventh memory device 700, the inside of the recording material layer 530 is filled with an oxygen scavenger layer 615 and insulating layers 620. The oxygen scavenger layer 615 of the seventh memory device 700 may be a semiconductor layer doped with a dopant (e.g., a Si layer). The insulating layers 620 are provided respectively on the lower end and upper end of the oxygen scavenger layer 615, which is formed parallel to the recording material layer 530 in a direction perpendicular to the substrate 520 (i.e., the Z-axis direction). The insulating layers 620 are provided between the lower end of the oxygen scavenger layer 615 and the substrate 520 and between the upper end of the oxygen scavenger layer 615 and a drain region 680, respectively. Accordingly, in the seventh memory device 700, the doped oxygen scavenger layer 615 may be prevented or reduced from being in direct contact with the substrate 520 and the drain region 680.

As illustrated in FIG. 13, in the eighth memory device 800, the oxygen scavenger layer 515, which is arranged between the recording material layer 530 and the insulating structure 510, includes first and second sub-material layers 515a and 515b (hereinafter, also referred to as the plurality of layers 515a and 515b) sequentially stacked in a direction parallel to the substrate 520 (i.e., a direction parallel to the X-axis). In an example, the functions and materials of the first and second sub-material layers 515a and 515b may be the same as those of the first and second sub-material layers 420a and 420b of the fourth memory device 400 of FIG. 4.

As illustrated in FIG. 14, the ninth memory device 900 includes an oxygen scavenger layer 815 formed as a metal layer between the recording material layer 530 and the insulating structure 510, to be parallel to the length direction of the recording material layer 530. The length of the oxygen scavenger layer 815 may be less than that of the recording material layer 530. Insulating layers 820 are provided between the upper end of the oxygen scavenger layer 815 and the drain region 680 and between the lower end of the oxygen scavenger layer 815 and the substrate 520, respectively. Accordingly, the oxygen scavenger layer 815, which is a metal layer, may be prevented from or reduced in likelihood of being in direct contact with the substrate 520 and the drain region 680. In an example, the insulating layer 820 may be an oxide layer or a nitride layer. The oxide layer may be an oxide layer that does not include a metal, or may be a metal oxide layer.

Hereinafter, common detailed configurations of the fifth to ninth memory devices 500, 600, 700, 800, and 900 will be described with reference to FIGS. 10 to 16.

A plurality of cell strings CS are provided on the substrate 520.

The substrate 520 may include a silicon material doped with a first type impurity. For example, the substrate 520 may include a silicon material doped with a p-type impurity. For example, the substrate 520 may be a p-type well (e.g., a pocket p-well). Hereinafter, it is assumed that the substrate 520 is p-type silicon. However, the substrate 520 is not limited to p-type silicon.

A doping region 525 (hereinafter, also referred to as the common source region 525), which is a source region, is provided on the substrate 520. The doping region 525 may be of n-type different from the substrate 520. Hereinafter, it is assumed that the doping region 525 is of n-type. However, the doping region 525 is not limited to n-type. The doping region 525 may be connected to common source lines CSL.

As shown in the circuit diagram of FIG. 16, k*n cell strings CS may be arranged in a matrix form, and each of them may be referred to as $CS_{ij}$ ($1 \le i \le k$, $1 \le n \cdot n$) according to the positions of its row and column. Each cell string $CS_{ij}$ is connected to a bit line BLj, a string selection line SSLi, a word line WL, and a common source line CSLi.

Each cell string $CS_{ij}$ includes the memory cells MC and a string selection transistor SST. The memory cells MC and the string selection transistor SST of each cell string $CS_{ij}$ may be stacked in a height direction.

The plurality of rows of the cell strings CS are connected to different string selection lines $SSL_1$ to $SSL_k$, respectively. For example, the string selection transistors SST of the cell strings $CS_{11}$ to $CS_{1n}$ are commonly connected to the string selection line $SSL_1$. The string selection transistors SST of the cell strings $CS_{k1}$ to $CS_{kn}$ are commonly connected to the string selection line $SSL_k$.

The plurality of columns of the cell strings CS are connected to different bit lines $BL_1$ to $BL_n$, respectively. For example, the memory cells MC and the string selection transistors SST of the cell strings $CS_{11}$ to $CS_{k1}$ may be commonly connected to the bit line $BL_1$, and the memory cells MC and the string selection transistors SST of the cell strings $CS_{1n}$ to $CS_{kn}$ may be commonly connected to the bit line $BL_n$.

The plurality of rows of the cell strings CS may be connected to different common source lines $CSL_1$ to $CSL_k$, respectively. For example, the string selection transistors SST of the cell strings $CS_{11}$ to $CS_{1n}$ may be commonly connected to the common source line $CSL_1$, and the string selection transistors SST of the cell strings $CS_{k1}$ to $CS_{kn}$ may be commonly connected to the common source line $CSL_k$.

Gate electrodes of the memory cells MC positioned at the same height from the substrate 520 or the string selection transistors SST may be commonly connected to one of the word lines WL, and gate electrodes of the memory cells MC positioned at different heights may be respectively connected to different word lines $WL_1$ to $WL_n$.

The illustrated circuit structure is only an example. For example, the number of rows of the cell strings CS may be increased or decreased. As the number of rows of the cell string CS varies, the number of string selection lines SSL1 to SSLk connected to the rows of the cell string CS and the number of cell strings CS connected to one bit line may also vary. As the number of rows of the cell strings CS varies, the number of common source lines CSL1 to CSLk connected to the rows of the cell strings CS may also vary.

The number of columns of the cell strings CS may also be increased or decreased. As the number of columns of the cell strings CSs varies, the number of bit lines BL1 to BLn connected to the columns of the cell strings CSs and the number of cell strings CS connected to one string selection line SSL may also vary.

The height of the cell strings CSs may also be increased or decreased. For example, the number of memory cells MC stacked in each of the cell strings CS may be increased or decreased. As the number of memory cells MC stacked in each of the cell strings CSs varies, the number of word lines WL may also vary. For example, the number of string selection transistors SST provided to each of the cell strings CS may be increased. As the number of string selection transistors SST provided to each of the cell strings CS varies, the number of string selection lines SSL or the number of common source lines CSL may also vary. When the number of string selection transistors SST is increased, the string selection transistors SST may be stacked like the memory cells MC.

For example, write and read operations may be performed in units of rows of the cell strings CS. The cell strings CS may be selected by the common source line CSL in units of one row, and the cell strings CS may be selected by the string selection lines SSL in units of one row. In addition, a voltage may be applied to the common source line CSL in units of at least two common source lines of the common source line CSL. Also, the voltage may be applied to the common source line CSL in units of the total common source line CSL.

In a selected row of the cell strings CS, write and read operations may be performed in units of pages. A page may denote one row of memory cells MC connected to one word line WL. In the selected row of the cell strings CS, the memory cells MC may be selected by the word lines WL1 to WLn in units of pages.

Each of the cell strings CS may have a structure in which a plurality of gate electrodes 560 and a plurality of isolation layers 570 alternately surround a first structure including the insulating structure 510, the oxygen scavenger layer 515 or 815, the recording material layer 530, a native oxide layer 535, a channel layer 540, and a gate insulating layer 550 as illustrated in FIGS. 10 and 13 to 15, or a second structure including the oxygen scavenger layer 515 or 615, which also serves as an insulating structure, the recording material layer 530, the natural oxide layer 535, the channel layer 540, and the gate insulating layer 550 as illustrated in FIGS. 11 and 12. Although FIG. 15 illustrates the cell string CS has the shape of a quadrangular post, this is only an example, and the shape of the cell string CS is not limited thereto. For example, the cell string CS may be formed in a cylindrical shape. For convenience of illustration, the native oxide layer 535 is not illustrated in FIG. 15.

Hereinafter, the configuration of the first structure including the insulating structure 510, the oxygen scavenger layer 515 or 815, the recording material layer 530, the native oxide layer 535, the channel layer 540, and the gate insulating layer 550 will be described.

For example, referring to FIG. 10, the insulating structure 510 has the shape of a cylinder having a length direction in the Z-axis direction, and the oxygen scavenger layer 515, the recording material layer 530, the native oxide layer 535, the channel layer 540, and the gate insulating layer 550 are sequentially stacked along the radial direction on the flat surface of the cylinder.

Hereinafter, the configuration of the second structure including the oxygen scavenger layer 515 or 615, which also serves as an insulating structure, the recording material layer 530, the native oxide layer 535, the channel layer 540, and the gate insulating layer 550 will be described.

For example, referring to FIG. 11, the oxygen scavenger layer 515, which also serves as/acts as an insulating structure, has the shape of a cylinder having a length direction in the Z-axis direction, and the recording material layer 530, the native oxide layer 535, the channel layer 540, and the gate insulating layer 550 are sequentially stacked along the radial direction on the flat surface of the cylinder.

In FIG. 11, the inside of the recording material layer 530 may be filled with the oxygen scavenger layer 515, and the oxygen scavenger layer 515 may be an undoped semiconductor layer (e.g., a Si layer). In this case, the recording material layer 530 may extend between the oxygen scavenger layer 515 and the substrate 520 to prevent or reduce the likelihood of the oxygen scavenger layer 515 from being in contact with the substrate 520.

In some examples, the recording material layer 530 may include a variable resistance material or a phase change material. The variable resistance material may be any one or more of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Sc_2O_3$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, and $MnO_2$. The phase change material may be $GST(Ge_2Sb_2Te_5)$.

In some examples, the channel layer 540 may include a semiconductor material doped with a first-type dopant. The channel layer 540 may include a silicon material doped with the same type dopant as that of the substrate 520, and for example, when the substrate 520 includes a silicon material doped with a p-type dopant, the channel layer 540 may also include a silicon material doped with a p-type dopant. Alternatively, the channel layer 540 may include a material such as one or more of Ge, IGZO, or GaAs.

The gate insulating layer 550 surrounds the surface of the channel layer 540 with a preset or variably determined thickness. The gate insulating layer 550 may be formed of various insulating materials such as one or more of silicon oxide, silicon nitride, or silicon oxynitride.

The plurality of gate electrodes 560 and the plurality of isolation layers 570 surround the outer surface of the second structure. For example, the plurality of gate electrodes 560 and the plurality of separation layers/isolation layers 570 are provided on the outer surface of the gate insulating layer 550, to surround the outer surface of the gate insulating layer 550. The plurality of isolation layers 570 are provided to separate the plurality of gate electrodes 560 from each other, and the plurality of gate electrodes 560 and the plurality of isolation layers 570 may be alternatively stacked each other in a direction perpendicular to the substrate 520 (i.e., the Z direction).

The gate electrode 560 may be formed of a metal material or a silicon material doped at a high concentration. Each gate electrode 560 is connected to one of the word line WL and the string selection line SSL. The isolation layer 570 may be formed of various insulating materials such as one or more of silicon oxide, silicon nitride, and the like.

The components of the cell string CS described above may be formed in an order from external components to internal components. For example, a structure in which the gate electrodes 560 and the isolation layers 570, which has the shape of a cylindrical shell with the same outer diameter and inner diameter, are alternately stacked may be first formed, and then the gate insulating layer 550, the channel layer 540, the recording material layer 530, and the oxygen scavenger layer 515, 615, or 815 may be sequentially deposited on the inner surface of the structure. After the channel layer 540 is formed, the native oxide layer 535 may be naturally formed on the inner surface of the channel layer 540, and the deposition process of the recording material layer 530 may also affect the formation of the native oxide layer 535. The deposition of the material layers described above will be described in the description of a fabrication method below.

One ends of the channel layer 540 and the recording material layer 530 may be in contact with the doping region 525, for example, a common source region. The drain region 680 may be provided at the other ends of the channel layer 540 and the recording material layer 530. The drain region 680 may include a silicon material doped with a second-type dopant. For example, the drain region 680 may include a silicon material doped with an n-type dopant such one or more of phosphorus or arsenic. A bit line 590 may be provided on the drain region 680. The drain region 680 and the bit line 590 may be in contact with/direct contact with each other. In an example, the drain region 680 and the bit line 590 may be connected to each other through a contact plug.

Each gate electrode 560 and regions of the gate insulating layer 550, the channel layer 540, the recording material layer 530, and the oxygen scavenger layer 515, 615, or 815, the regions facing the gate electrode 560, may constitute the memory cell MC. For example, the memory cell MC has a circuit structure in which a transistor including the gate electrode 560, the gate insulating layer 550, and the channel layer 540, and a variable resistor provided by the recording material layer 530 and the oxygen scavenger layers 515, 615, or 815 are connected in parallel. The parallel connection structure is continuously arranged in a vertical direction (i.e., the Z direction) to constitute the cell string CS. As illustrated in the circuit diagram of FIG. 16, both ends of the cell string CS may be connected to the common source line CSL and the bit line BL, respectively. When an operation voltage is applied to the common source line CSL and the bit line BL, various operations, for example, program (write), read, and erase operations, may be performed in the plurality of memory cells MC.

For example, when one of the memory cells MC to be written is selected, a gate voltage value of the selected memory cell is adjusted such that a channel is not formed in the selected memory cell, that is, such that the channel is turned off. On the other hand, gate voltage values of the unselected memory cells are adjusted such that channels therein are turned on. Accordingly, a current path formed by the voltage applied to the common source line CSL and the bit line BL passes through the recording material layer 530 of the selected memory cell MC. At this time, when the applied voltage is $V_{set}$ or $V_{reset}$, the recording material layer 530 of the selected memory cell MC is in a low-resistance state or a high-resistance state, respectively. In this way, intended information of logical '1' or '0' is written in the selected memory cell MC.

In a read operation, reading of a selected cell may be performed similarly to the write operation described above. For example, after a gate voltage applied to each gate electrode 560 is adjusted such that a selected memory cell MC is in a channel-OFF state and unselected memory cells are in a channel-ON state, a read voltage $V_{read}$ may be applied between the common source line CSL and the bit line BL to measure a current flowing through the corresponding memory cell MC, and thus check the state (1 or 0) of the corresponding memory cell MC.

In such a VNAND structure, there is a limitation in increasing the number of gate electrodes 560 included in the cell string CS due to a packaging limitation according to the height of the cell string CS. In particular, there is a limitation in reducing the distance between adjacent gate electrodes 560 due to interference between adjacent memory cells. Accordingly, a limit in reducing the sum of the vertical lengths of the gate electrode 560 and the separation layer/isolation layer 570 adjacent to each other in the vertical direction (i.e., the Z direction) may indicate a limit in the memory capacity.

As described above, the fifth to ninth memory devices 500, 600, 700, 800, and 900 include the oxygen scavenger layer 515, 615, or 815 on the inner surface of the recording material layer 530, the oxygen scavenger layer 515, 615, or 815 being in direct contact with the recording material layer 530. Accordingly, in an operation of the memory device, oxygen vacancies may be easily formed in the recording material layer 530, and an element (e.g., oxygen) that reduces the oxygen vacancies of the recording material layer 530 may be prevented from or reduced in likelihood of being introduced from the inside of the recording material layer 530. Therefore, a resistance change operation of the recording material layer 530 may be more likely to be performed normally and/or stably. This may help increase the integration density and/or the reliability of and/or the yield of the memory device.

FIGS. 17 to 25B sequentially show a method of fabricating a memory device, according to some example embodiments. Drawings with 'A' (e.g., FIG. 18A) are cross-sectional views, and drawing with 'B' (e.g., FIG. 18B) are plan views.

Figure 17:
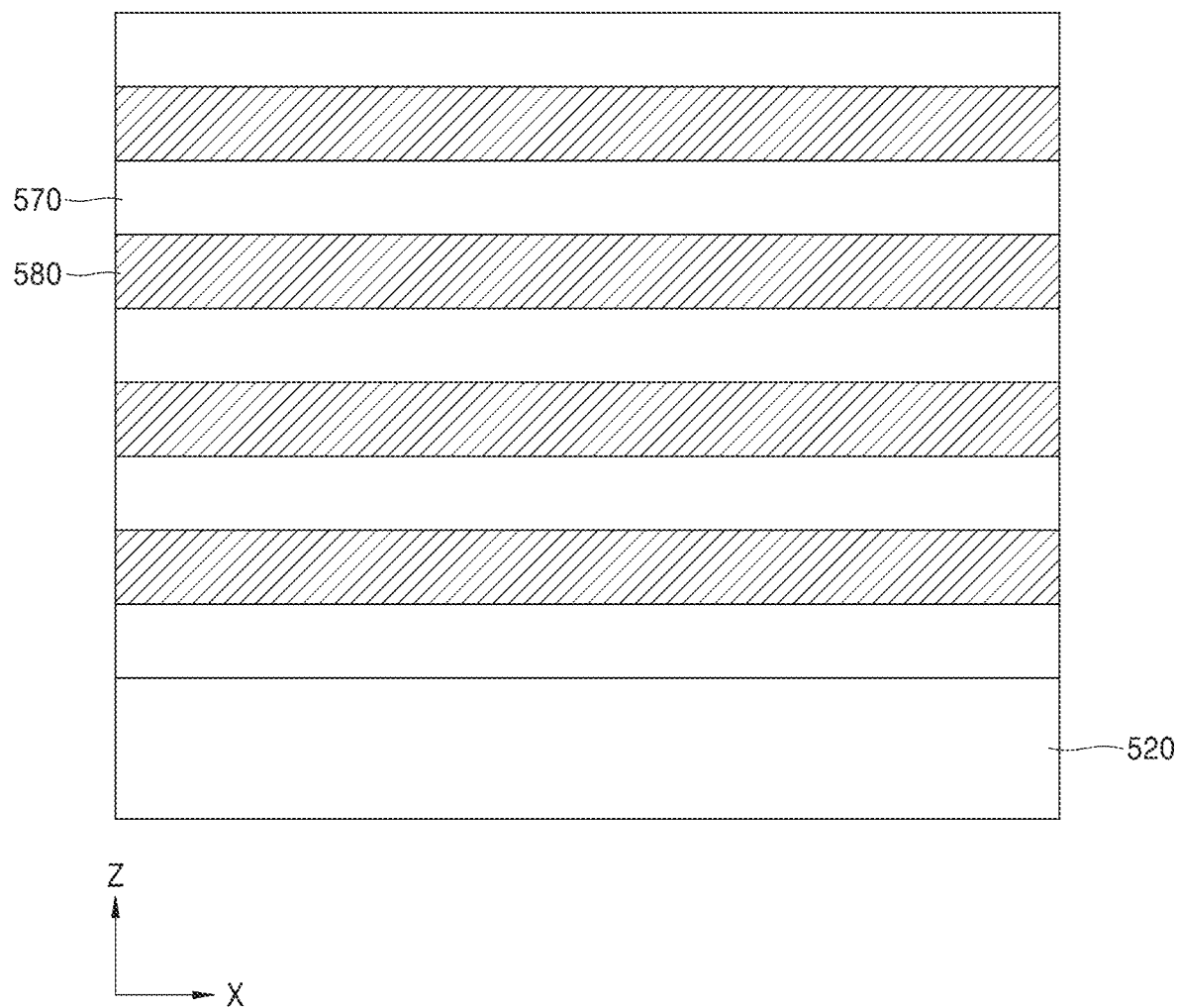
FIGS. 17 to 25B are diagrams for describing a method of fabricating a memory device, according to some example embodiments.

Referring to FIG. 17, a stack structure in which the isolation layers 570 and sacrificial layers 580 are alternately and repeatedly stacked is formed on the substrate 520. In an example, the substrate 520 may be a silicon substrate, for example, a silicon substrate doped with a certain impurity. The substrate 520 may be, but is not limited to, a p-type silicon (e.g. single-crystal silicon) substrate.

The isolation layer 570 is formed of an insulating material, and may include, for example, $SiO_2$. The sacrificial layer 580 is formed of a material having an etch rate different from that of the material of the isolation layer 570. The isolation layer 570 may include, for example, $SiN_x$. The thickness of the isolation layer 570 and the thickness of the sacrificial layer 580 may be respectively determined according to a detailed structure of a memory device to be fabricated. The thickness of the isolation layer 570 and the thickness of the sacrificial layer 580 may correspond to the interval between gate electrodes and the length of the gate electrodes of the memory device to be fabricated, respectively. In some examples, the thickness of the sacrificial layer 580 may be about 5 nm to about 30 nm. In some examples, the thickness of the isolation layer 570 may be 5 nm to 30 nm. In a subsequent process, a gate electrode is formed at a position of the sacrificial layer 580. Accordingly, the number of sacrificial layers 580 may correspond to the number of unit cells of the memory device to be fabricated.

In order to form the isolation layer 570 and the sacrificial layer 580, a deposition method such as one or more of atomic layer deposition (ALD), metal organic atomic layer deposition (MOALD), chemical vapor deposition (CVD), metal organic CVD (MOCVD), or physical vapor deposition (PVD) may be used. The methods include placing the substrate 520 in a chamber and supplying a source to the chamber while heating the chamber at a preset or variably determined temperature. Process conditions such as temperature and time may be adjusted according to various or preferred thicknesses of the isolation layer 570 and the sacrificial layer 580.

Figure 18A:
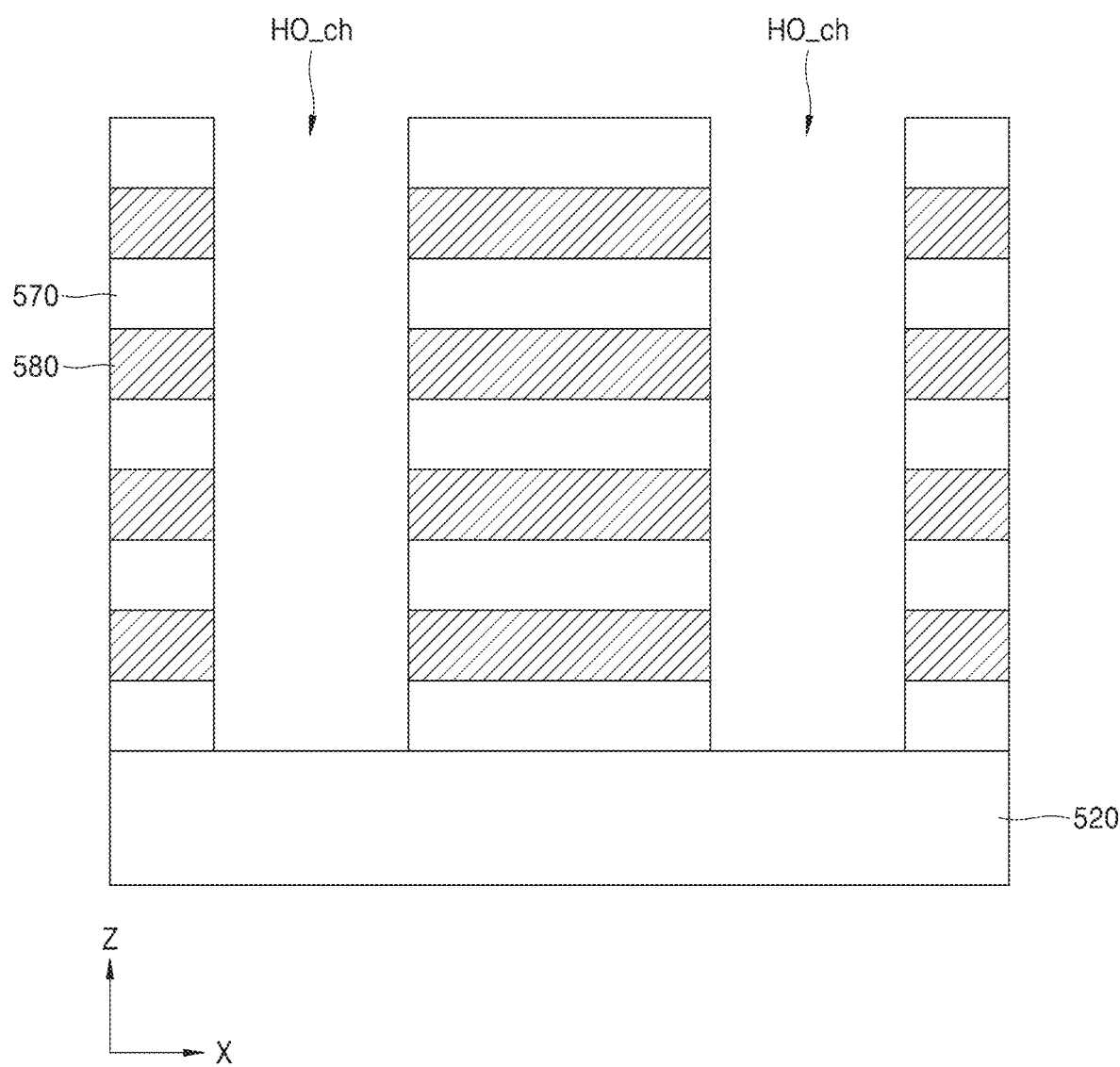
Figure 18B:
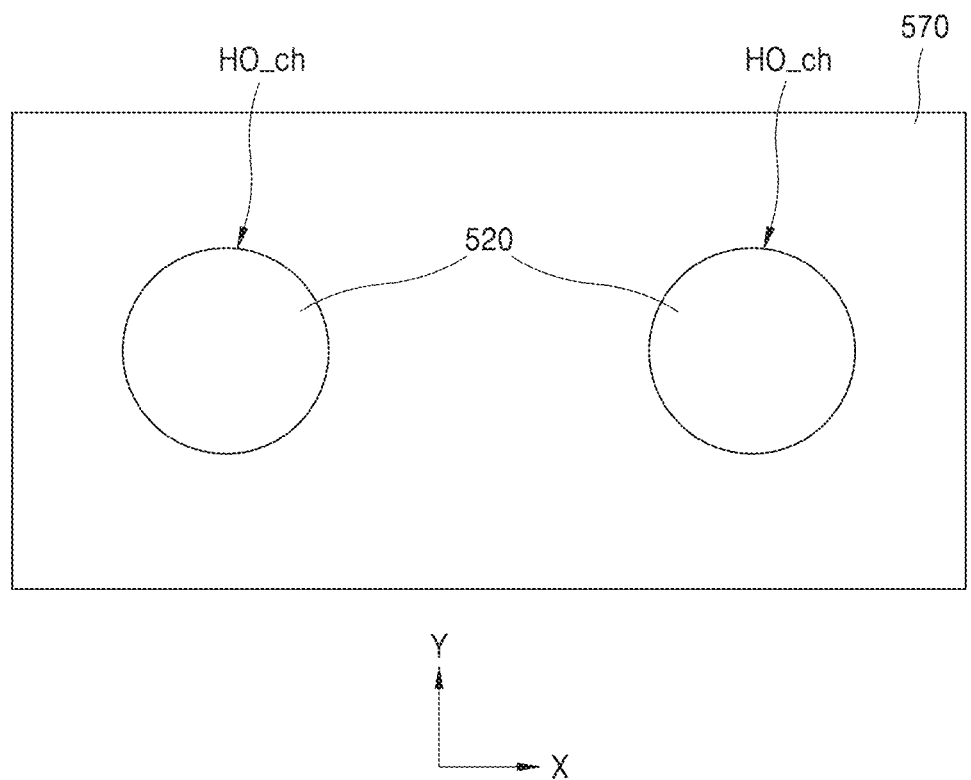

Thereafter, as illustrated in FIGS. 18A and 18B, channel holes HO_ch are formed in the stack structure of FIG. 17. The channel hole HO_ch is a hole for applying a gate insulating material, a channel material, a recording material, an oxygen scavenger material, and/or the like. A photolithography process and an etching process, such as a wet and/or dry etching process, may be used to form the channel holes HO_ch. The number of the channel holes HO_ch is illustrated as two, but this is only an example. For example, as many channel holes HO_ch as the number of cell strings CS described with reference to FIGS. 10 to 16 may be formed.

Figure 19:
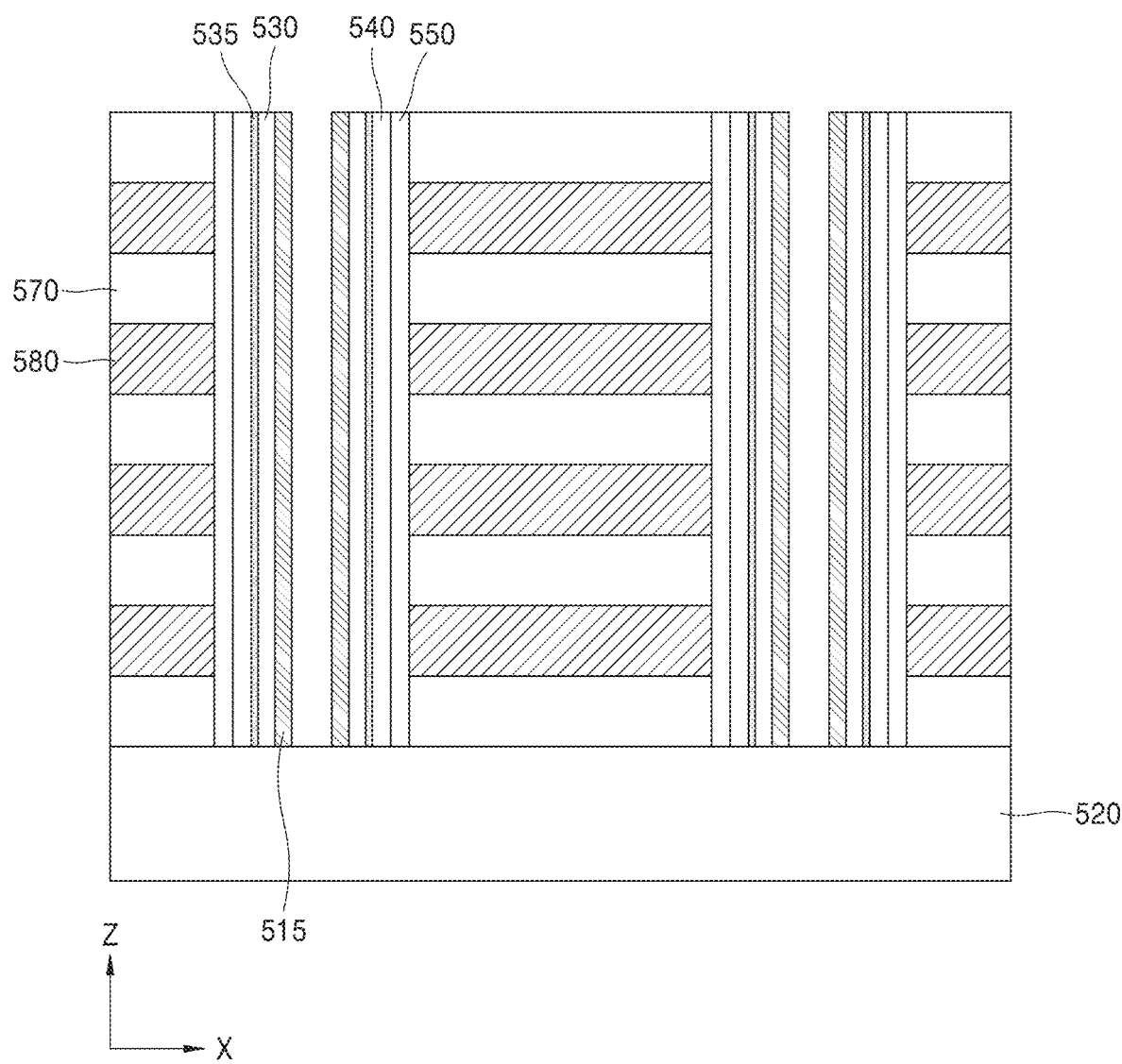

Thereafter, as illustrated in FIG. 19, the gate insulating layer 550, the channel layer 540, the recording material layer 530, and the oxygen scavenger layer 515 are sequentially formed on the inner surface of the channel hole HO_ch. At this time, the native oxide layer ($SiO_2$) 535 may be naturally formed on the inner surface of the channel layer 540. Also, a native oxide layer may be added to the inner surface of the channel layer 540 by an oxidizing agent (e.g., one or more of $O_3$, $H_2O$, etc.) which is used when the recording material layer 530 is formed. In an example, before forming the recording material layer 530, a process of removing or reducing the native oxide layer 535 may be performed. The gate insulating layer 550 may be formed of various insulating materials such as one or more of silicon oxide, silicon nitride, or silicon oxynitride. The channel layer 540 may be formed of a semiconductor material, and may include, for example, poly-Si. The channel layer 540 may be doped with a certain dopant, and may be doped with a p-type dopant such as boron, similar to the substrate 520. However, some example embodiments are not limited thereto. The channel layer 540 may include, for example, Ge, IGZO, or GaAs. The recording material layer 530 may include a variable resistance material or a phase change material. The variable resistance material may be any one of $Rb_2O$, $TiO_2$, BaO, $ZrO_2$, CaO, $HfO_2$, SrO, $Sc_2O_3$, MgO, $Li_2O$, $Al_2O_3$, $SiO_2$, BeO, $Sc_2O_3$, $Nb_2O_5$, NiO, $Ta_2O_5$, $WO_3$, $V_2O_5$, $La_2O_3$, $Gd_2O_3$, CuO, $MoO_3$, $Cr_2O_3$, and $MnO_2$. The phase change material may be GST($Ge_2Sb_2Te_5$).

The oxygen scavenger layer 515 may be a semiconductor layer, or may include a semiconductor layer. For example, when forming the semiconductor layer, the semiconductor layer may be doped with a dopant or may not be doped. The dopant may be p-type or n-type. The semiconductor layer may include silicon. In some examples, the oxygen scavenger layer 515 may be a metal layer including one metal component or two or more metal components, or may include such a metal layer. In some examples, the oxygen scavenger layer 515 may be formed as the plurality of layers 515a and 515b as illustrated in FIG. 13. In some examples, the oxygen scavenger layer 515 may be formed as an insulating layer including a component (e.g., Si) that does not include oxygen and has a relatively high reactivity with oxygen. For example, the oxygen scavenger layer 515 may be a silicon nitride layer (e.g., SiN), or may include a silicon nitride layer. In some examples, the oxygen scavenger layer 515 may be a metal oxide layer, or may include a metal oxide layer. For example, the metal oxide layer may include an $Al_2O_3$ layer and/or a $La_2O_3$ layer.

In the case where the oxygen scavenger layer 515 is formed as a doped semiconductor layer or a metal layer or is formed of a conductive metal oxide layer to have conductivity, the upper and lower ends of the oxygen scavenger layer 515 may be insulated or insulating layers may be further formed on the upper and lower ends, respectively. Accordingly, the oxygen scavenger layer 515 and the substrate 520 may be prevented/reduced from being in direct contact with each other, and the drain region 680 formed in a subsequent process and the oxygen scavenger layer 515 may also be prevented/reduced in likelihood from being in direct contact with each other.

In the case where the oxygen scavenger layer 515 is formed of the same material (e.g., Si) as that of the channel layer 540, the formation condition of the channel layer 540 may be applied to the formation of the oxygen scavenger layer 515 as it is, and thus, the process of fabricating a memory device may be simplified.

In order to form the material layers 550, 540, 530, and 515, deposition methods such as one or more of ALD, MOALD, CVD, MOCVD, PVD, plasma-enhanced ALD (PEALD), or the like may be used. The methods include placing the stack structure having the channel holes HO_ch formed therein in a chamber and supplying a source while heating the chamber at a preset or variably determined temperature, and process conditions such as temperature and/or time may be adjusted according to various/preferred thickness of each layer.

When a PEALD method is used, plasma damage may occur, and the plasma damage may cause formation of oxygen vacancies in the recording material layer 530. Accordingly, when the oxygen scavenger layer 515 is formed by using the PEALD method, oxygen vacancies may be more easily formed in the recording material layer 530, and thus a relatively large amount of oxygen vacancies may be formed.

After forming the gate insulating layer 550 and the channel layer 540 on the inner surface of the channel hole HO_ch and before forming the recording material layer 530, a process of removing an insulating material and a channel material deposited on the bottom surface of the channel hole HO_ch may be performed.

Figure 20A:
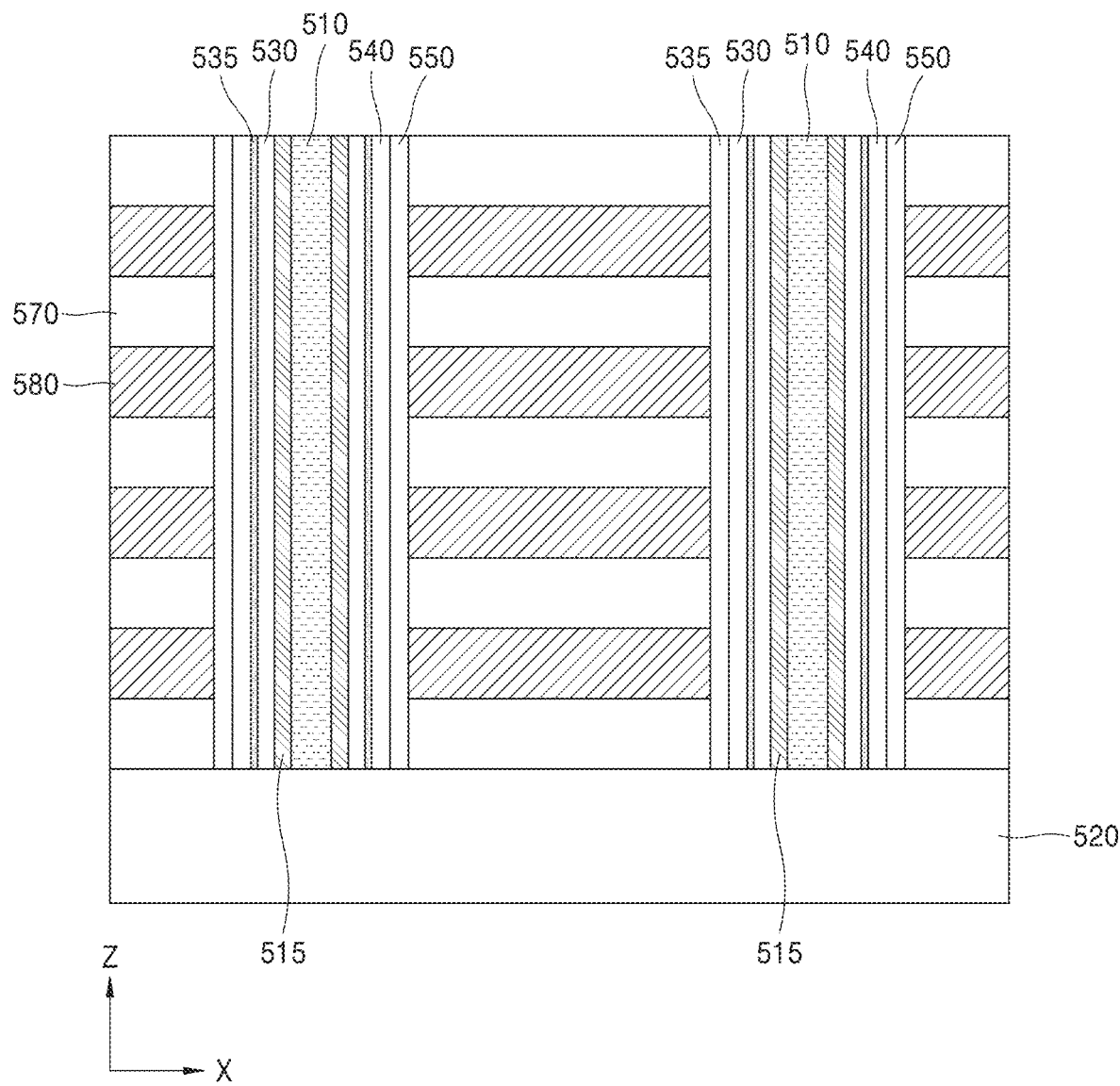
Figure 20B:
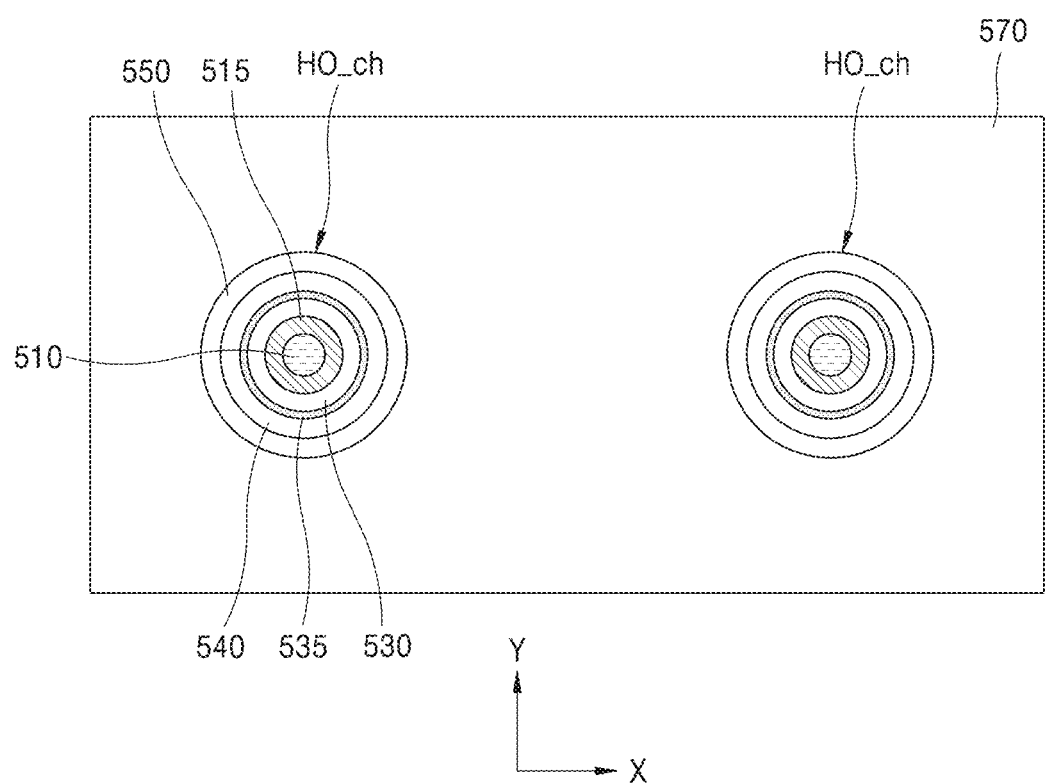

Thereafter, as illustrated in FIGS. 20A and 20B, the insulating structure 510 is formed in the remaining space in the channel hole HO_ch. The remaining space in the channel hole HO_ch may be filled/completely filled with the insulating structure 510. In the case where the remaining space in the channel hole HO_ch is filled with the insulating structure 510 and the oxygen scavenger layer 515 is formed between the insulating structure 510 and the recording material layer 530 as illustrated in FIG. 20A, the thickness of the oxygen scavenger layer 515 may be about 2 nm to about 20 nm.

Figure 22:
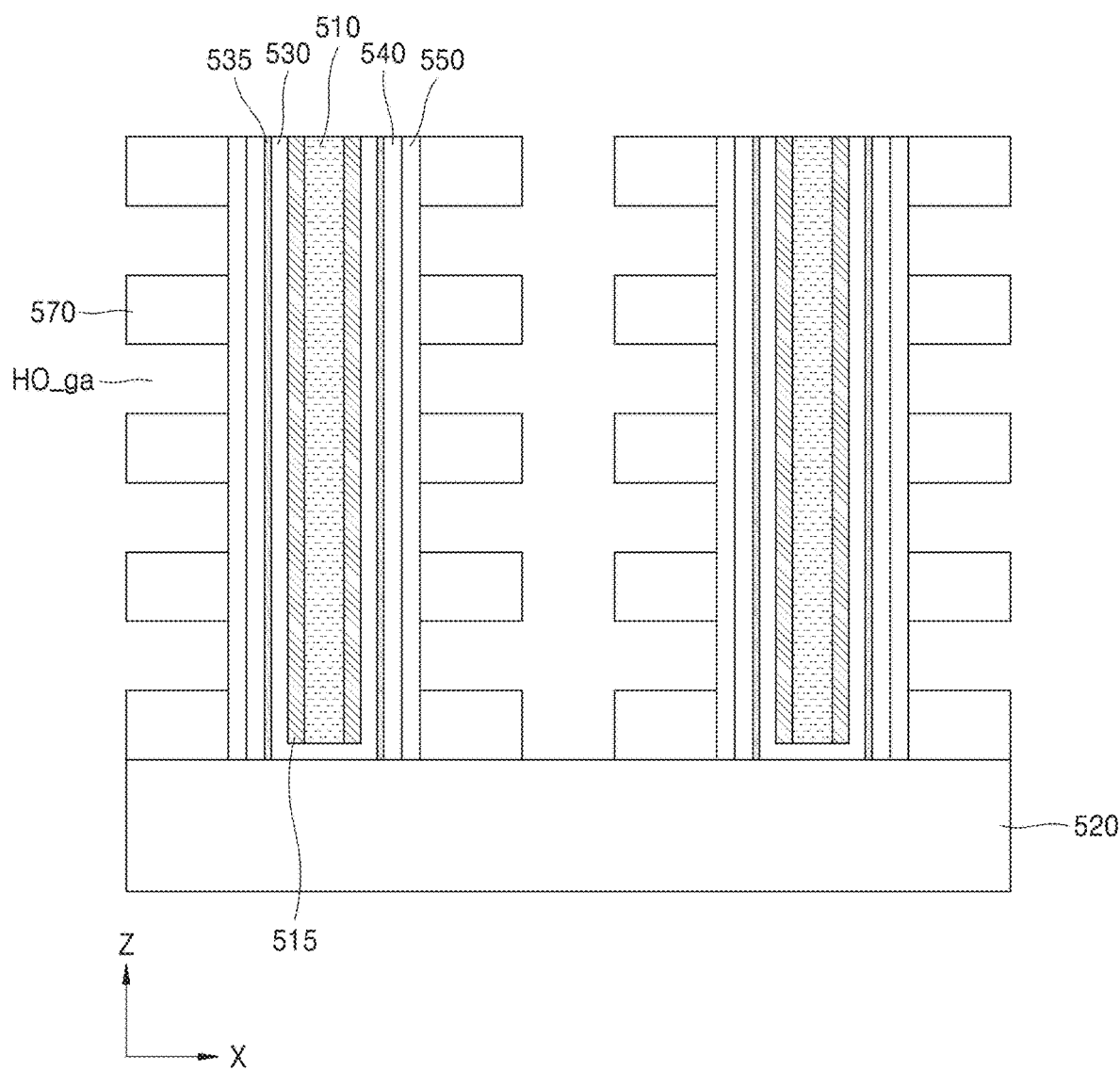

In some example embodiments, the remaining space in the channel hole HO_ch may be filled with the oxygen scavenger layer 515 instead of the insulating structure 510. In this case, as illustrated in FIG. 22, the recording material layer 530 may be formed to extend between the substrate 520 and the oxygen scavenger layer 515. In this way, in the case where the remaining space in the channel hole HO_ch is filled with the oxygen scavenger layer 515 instead of the insulating structure 510, the oxygen scavenger layer 515 may be prevented from/reduced in likelihood from being in direct contact with the substrate 520.

As described above, in the case where the remaining space in the oxygen channel hole HO_ch is filled with the oxygen scavenger layer 515 instead of the insulating structure 510 (see FIG. 11), the thickness of the oxygen scavenger layer 515 in a direction parallel to the X-axis, for example, the diameter of the oxygen scavenger layer 515 may be, but is not limited to, about 50 nm, or about 30 nm to 70 nm.

Example materials that may be used to fill the remaining space in the channel hole HO_ch may be collectively referred to as buried materials.

Figure 21:
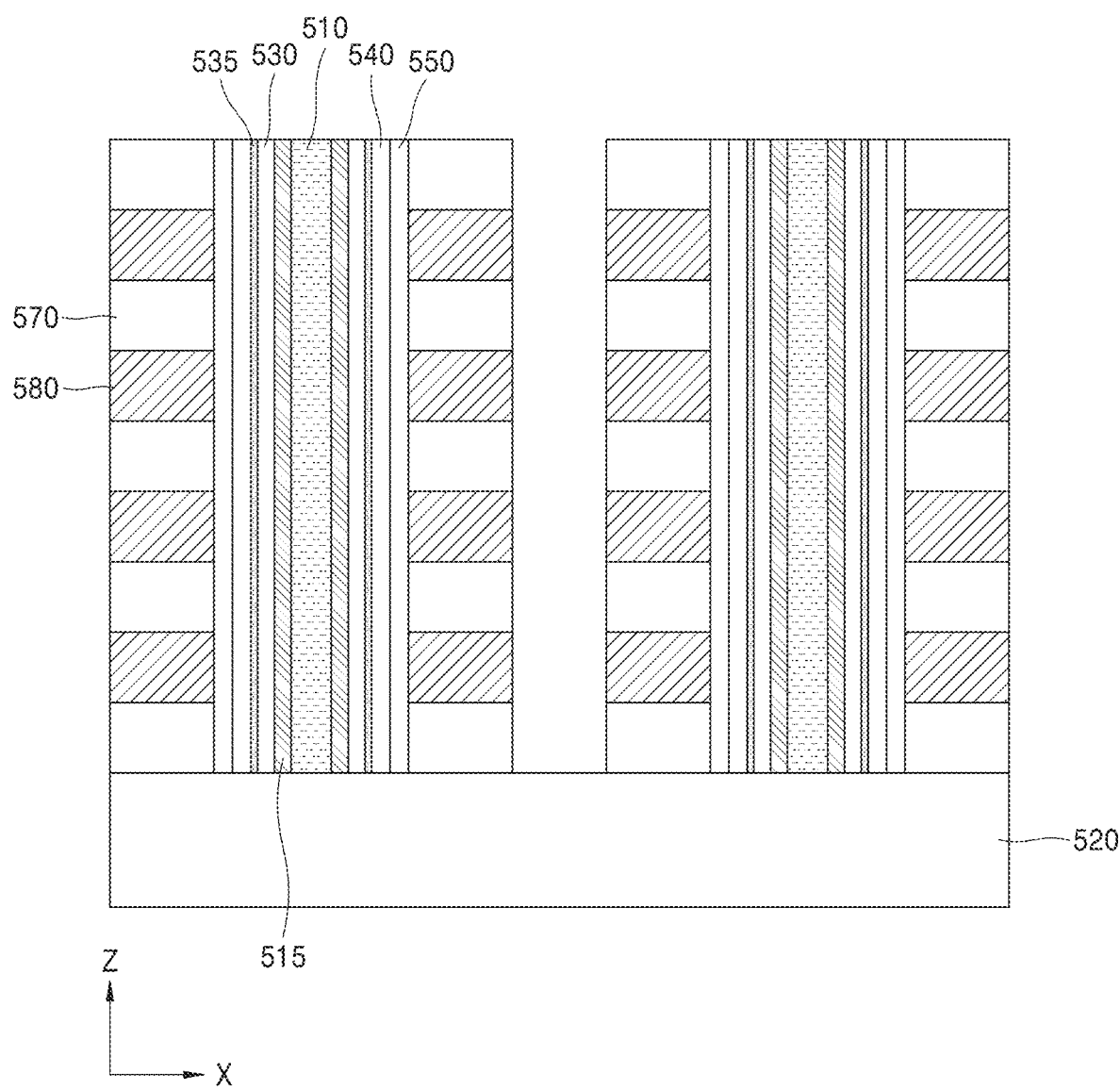

Thereafter, as illustrated in FIG. 21, the structure illustrated in FIG. 20A is etched and cut.

Figure 23:
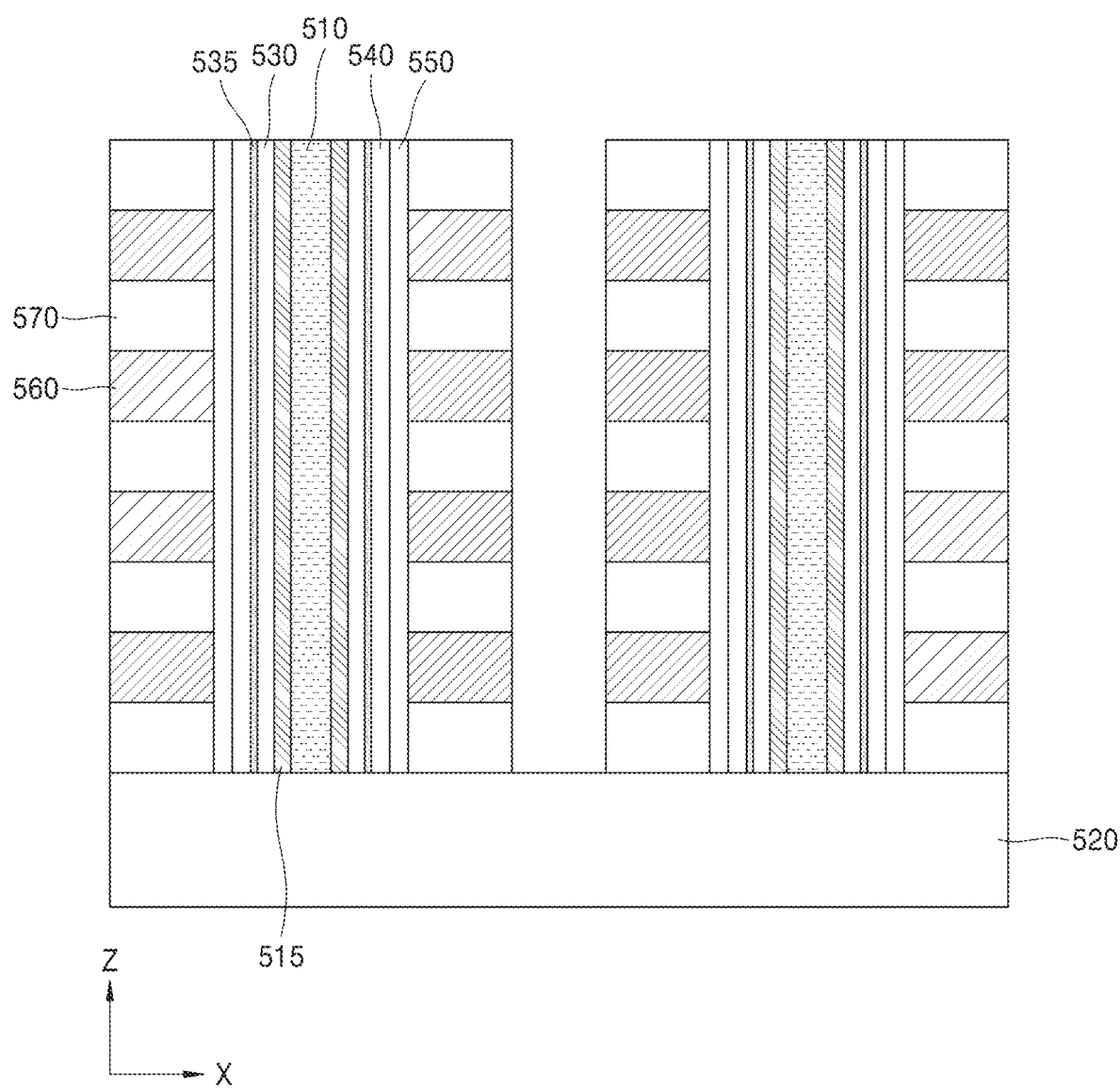

Then, the remaining sacrificial layers 580 are removed to form gate holes HO_ga as illustrated in FIG. 22, and an electrode material is deposited in the gate holes HO_ga to form gate electrodes 560 as illustrated in FIG. 23. In this way, two string cells CS are formed on the substrate 520.

Figure 24A:
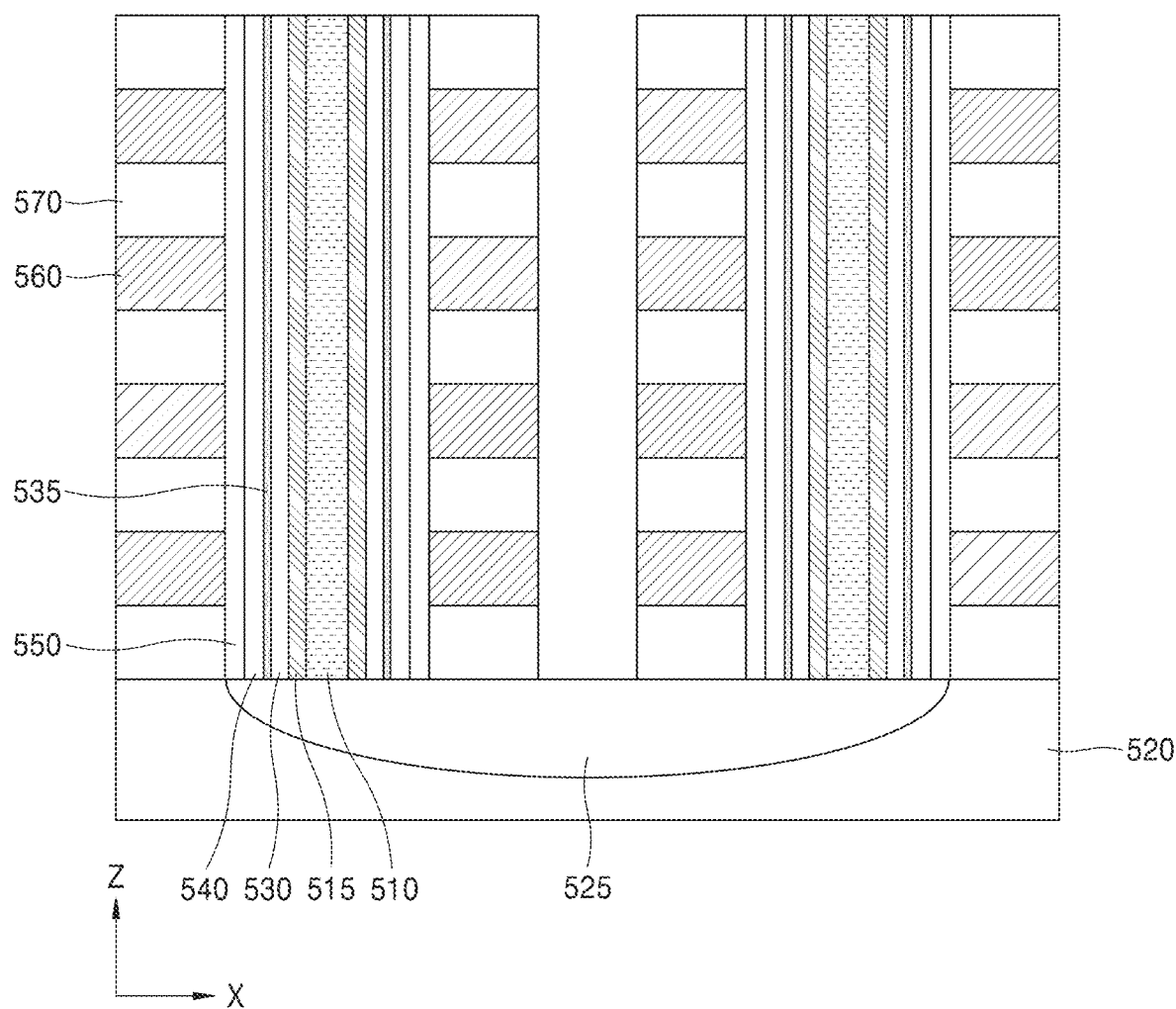
Figure 24B:
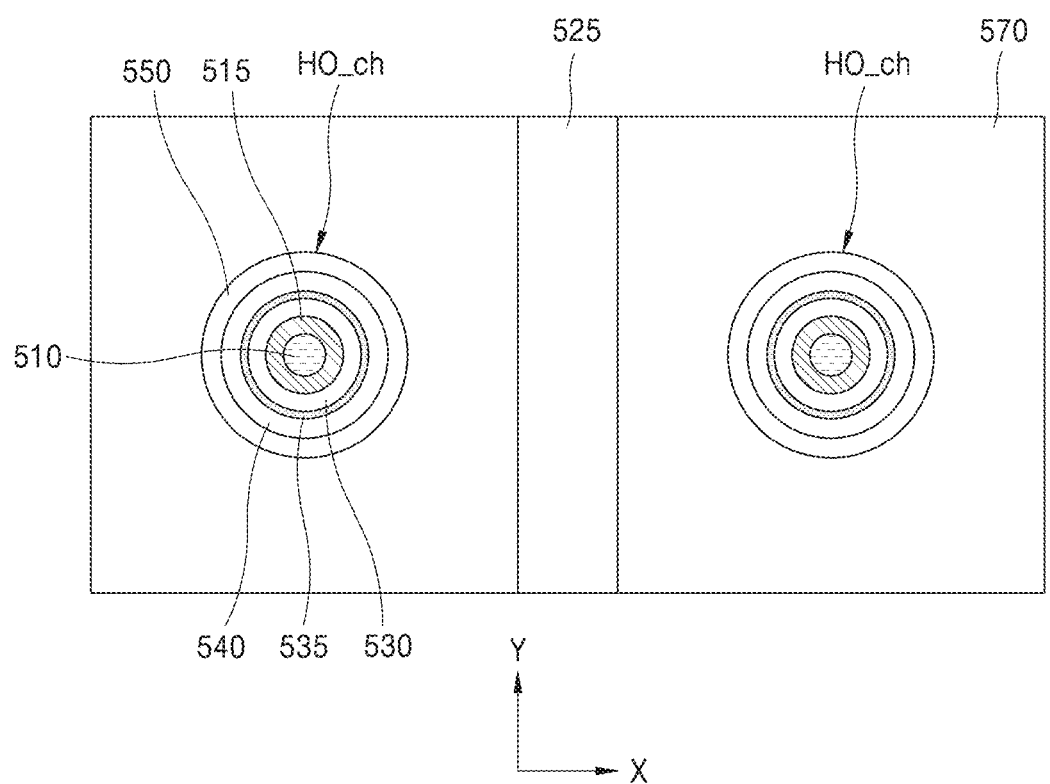

Thereafter, as illustrated in FIGS. 24A and 24B, the common source region 525 is formed in the substrate 520. In a process of forming the common source region 525, a dopant is injected into a certain region on the substrate/insulating structure 510 to form a high-concentration region, and the common source region 525 is formed to be in contact with the channel layer 540, the recording material layer 530, and the oxygen scavenger layer 515 of one end of each of the two string cells CS.

In the case where the recording material layer 530 is formed to cover the bottom surface of the channel hole HO_ch, the lower end of the oxygen scavenger layer 515 formed after the recording material layer 530 is formed may not be in contact with the substrate 520. Accordingly, in this case, the common source region 525 may be formed to be in contact with the channel layer 540 and the recording material layer 530 at one end of each of the two string cells CS.

Figure 25A:
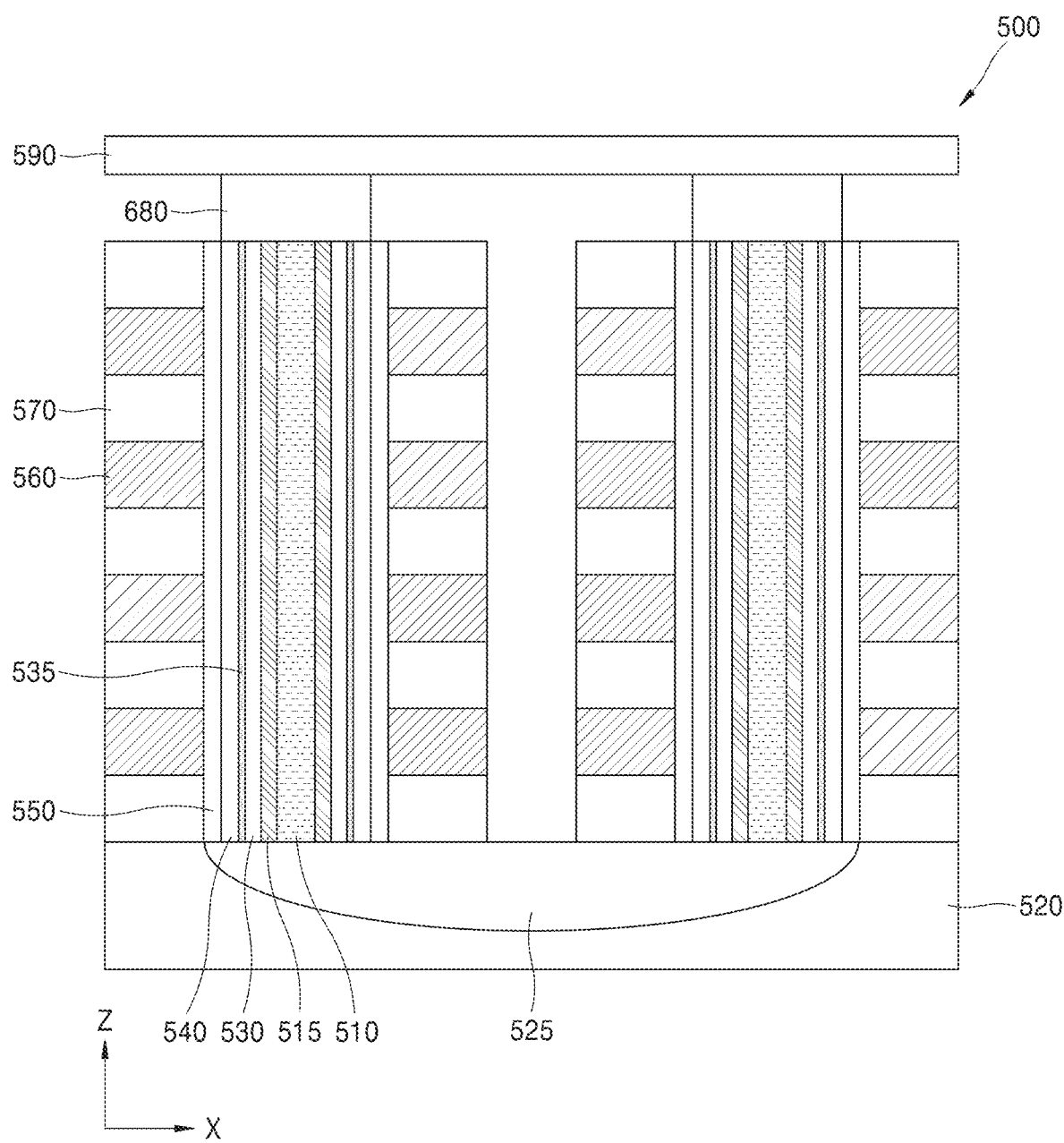
Figure 25B:
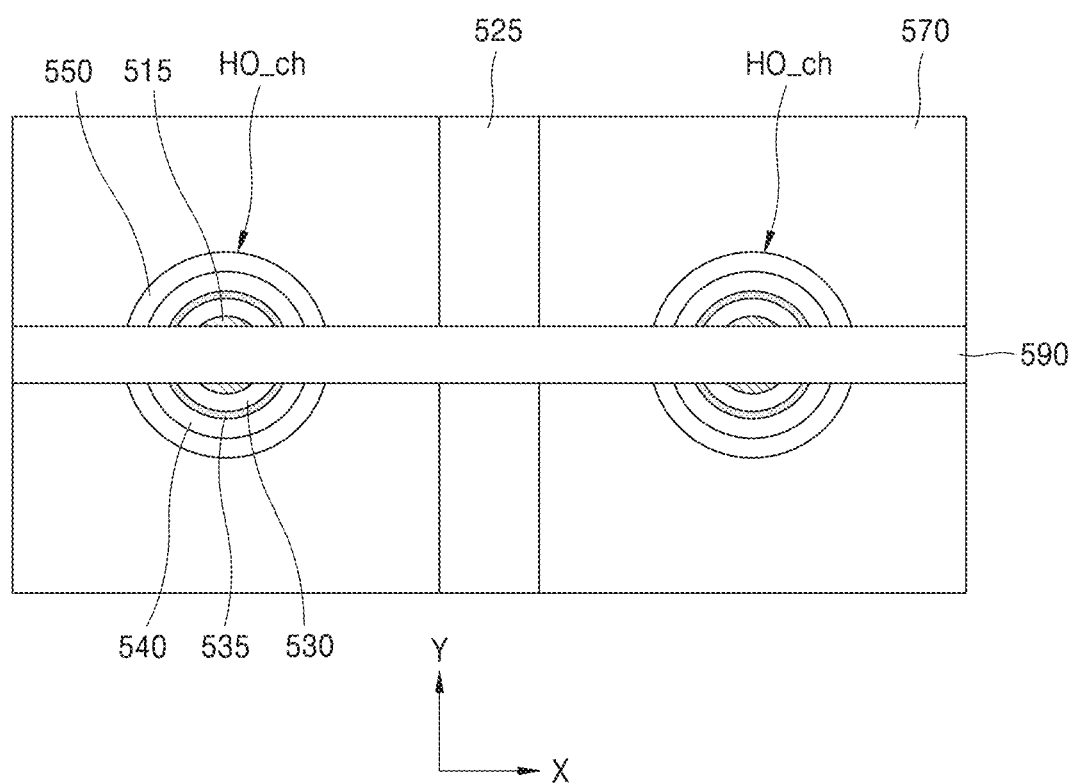

Thereafter, as illustrated in FIGS. 25A and 25B, the drain region 680 is formed to be connected to the other end of each of the two string cells CS, i.e., one ends (e.g., the upper ends) of the channel layer 540, the recording material layer 530, and the oxygen scavenger layer 515, which are opposite to the other ends (e.g., the lower ends) of the channel layer 540, the recording material layer 530, and the oxygen scavenger layer 515 in contact with the common source region 525, and then the bit line 590 is formed to be connected to the drain region 680 of each of the two string cells CS.

Each of the memory devices 100, 200, . . . , 900 according to example embodiments may be employed as a memory system of various electronic apparatuses. Each of the memory devices 100, 200, . . . , 900 may be implemented as a chip-type memory block to be used as a neuromorphic computing platform or to be used to configure a neural network.

Figure 26:
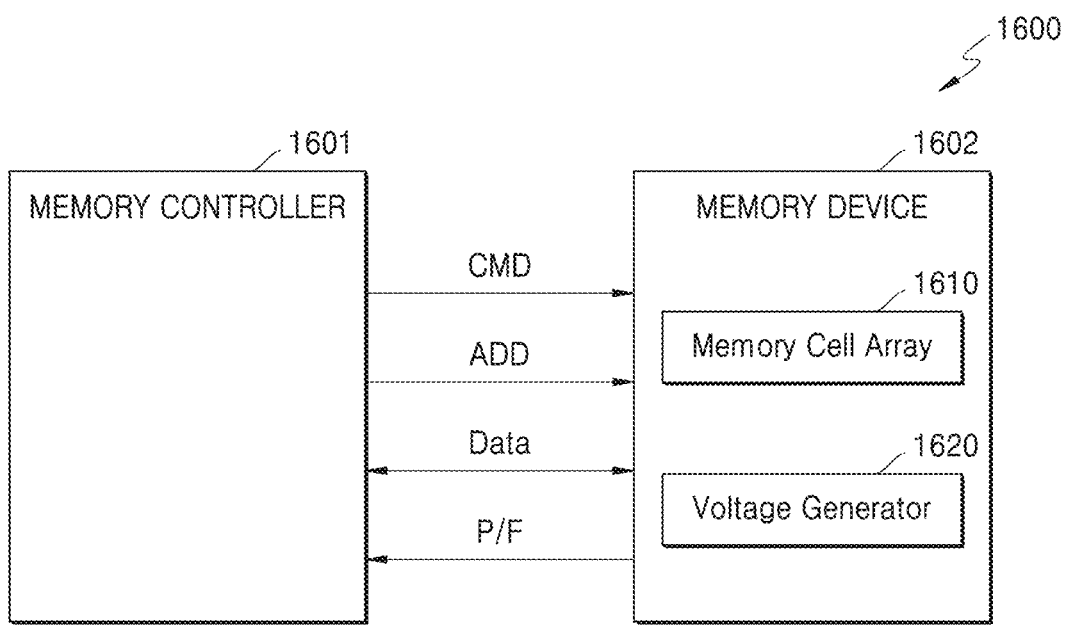
FIG. 26 is a block diagram of a memory system, according to some example embodiments.

FIG. 26 is a block diagram of a memory system 1600, according to some example embodiments.

Referring to FIG. 26, the memory system 1600 may include a memory controller 1601 and a memory device 1602. The memory controller 1601 performs a control operation on the memory device 1602, and, for example, the memory controller 1601 provides the memory device 1602 with an address ADD and also provides the memory device 1602 with a command CMD for performing program (or write), read and/or erase operations on the memory device 1602. In addition, data Data for a program operation and read data may be transmitted between the memory controller 1601 and the memory device 1602.

The memory device 1602 may include a memory cell array 1610 and a voltage generator 1620. The memory cell array 1610 may include a plurality of memory cells arranged in regions where a plurality of word lines and a plurality of bit lines intersect with each other. The memory cell array 1610 may include one of memory devices based on the embodiments described with reference to FIGS. 1 to 4 and 10 to 14.

The memory controller 1601 may include a processing circuitry such as hardware including logic circuits; a hardware/software combination such as a processor capable of executing software; or a combination thereof. For example, the processing circuitry may be, but is not limited to, a central processing unit (CPU), an arithmetic logic unit (ALU), a digital signal processor, a microcomputer, a field-programmable gate array (FPGA), a system-on-chip (SoC), a programmable logic unit, a microprocessor, an application-specific integrated circuit (ASIC), or the like. The memory controller 1601 may operate in response to a request from a host (not shown) and may access the memory device 1602 and control the control operations (e.g., write/read operations) discussed above. The memory controller 1601 may be configured to be converted into a special-purpose controller. The memory controller 1601 may generate the address ADD and the command CMD for performing program/read/erase operations on the memory cell array 1610. In addition, in response to a command from the memory controller 1601, the voltage generator 1620 (e.g., a power circuit) may generate a voltage control signal for controlling a voltage level of a word line for data programming or data reading on the memory cell array 1610.

Also, the memory controller 1601 may perform a determination operation on data read from the non-volatile memory device 1602. For example, from data read from memory cells, the number of on-cells and/or the number of off-cells may be determined. The memory device 1602 may provide the memory controller 1601 with a pass/fail signal P/F according to a reading result with respect to read data. The memory controller 1601 may control write and read operations of the memory cell array 1610 with reference to the pass/fail signal P/F.

Figure 27:
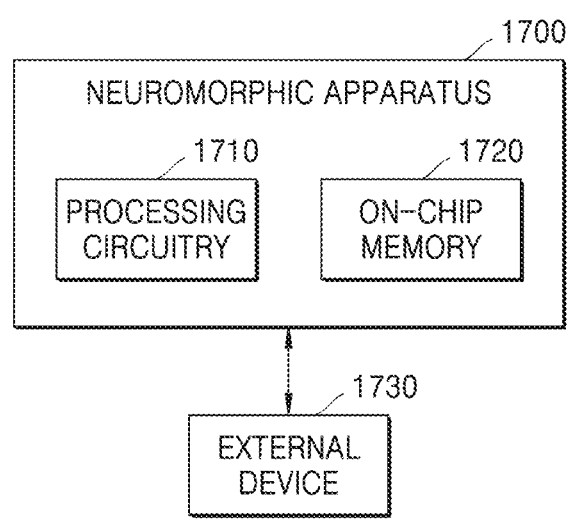
FIG. 27 is a block diagram illustrating a neuromorphic apparatus and an external device connected to the neuromorphic apparatus, according to some example embodiments.

FIG. 27 is a block diagram illustrating a neuromorphic apparatus 1700 and an external device 1730 connected thereto, according to some example embodiments.

Referring to FIG. 27, the neuromorphic apparatus 1700 may include a processing circuitry 1710 and/or an on-chip memory 1720. The neuromorphic apparatus 1700 may include one of memory devices based on the embodiments described with reference to FIGS. 1 to 4 and 10 to 14.

In some example embodiments, the processing circuitry 1710 may be configured to control a function for driving the neuromorphic apparatus 1700. For example, the processing circuitry 1710 may be configured to control the neuromorphic apparatus 1700 by executing a program stored in the memory 1720. In some example embodiments, the processing circuitry 1710 may include hardware such as a logic circuit, a hardware/software combination such as a processor capable of executing software, or a combination thereof. For example, the processor may include, but is not limited to, a CPU, a graphics processing unit (GPU), an application processor (AP) included in the neuromorphic apparatus 1700, an ALU, a digital signal processor, a microcomputer, an FPGA, an SoC, a programmable logic unit, a microprocessor, an ASIC, and the like. In some example embodiments, the processing circuitry 1710 may be configured to read/write various pieces of data from/to the external device 1730 and/or execute the neuromorphic apparatus 1700 by using the read/written data. In some embodiments, the external device 1730 may include an external memory having an image sensor (e.g., a complementary metal-oxide-semiconductor (CMOS) image sensor circuit) and/or a sensor array.

In some embodiments, the neuromorphic apparatus 1700 of FIG. 27 may be applied to a machine learning system. The machine learning system may use various artificial neural networks and processing models, such as a convolutional neural network (CNN), a deconvolutional neural network, a recurrent neural network (RNN) selectively including a long short-term memory (LSTM) unit and/or a gated recurrent unit (GRU), a stacked neural network (SNN), a state-space dynamic neural network (SSDNN), a deep belief network (DBN), a generative adversarial network (GAN), and/or a restricted Boltzmann machine (RBM).

Alternatively or additionally, the machine learning system may include other types of machine learning models, such as linear and/or logistic regression, statistical clustering, Bayesian classification, decision trees, dimensionality reduction such as principal component analysis, expert systems, and/or combinations thereof including ensembles such as random forests. The machine learning model may be used to provide various services and/or applications, and, for example, an image classification service, a user authentication service based on biometric information or biometric data, an advanced driver-assistance system (ADAS) service, a voice assistant service, an automatic speech recognition (ASR) service, and the like, may be executed by an electronic device.

Figure 28:
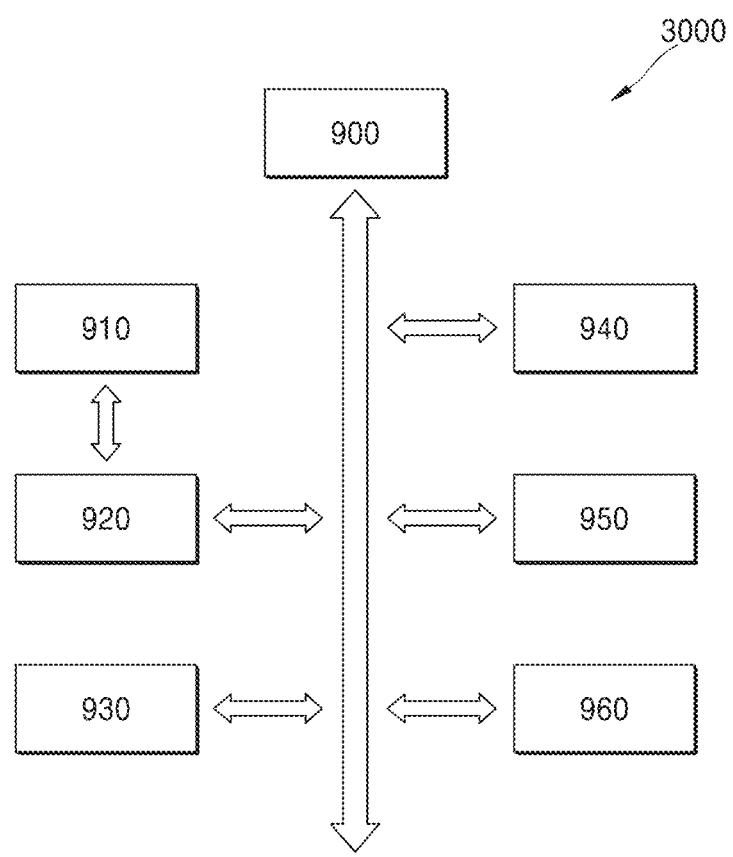
FIG. 28 is a block diagram illustrating an electronic apparatus according to some example embodiments.

FIG. 28 is a view schematically illustrating an electronic apparatus 3000 according to some example embodiments.

Referring to FIG. 28, the electronic apparatus 3000 may include an input device 910 configured to receiving a data signal from the outside, neuromorphic circuit 930 configured to store and output specific information by using the signal from the input device 910, and a processor 900 configured to process the information output from the neuromorphic circuit 930. In addition, the electronic apparatus 3000 may further include an analog-to-digital converter 920, a memory device 940, a communication device 950, and an output device 960.

The processor 900 may control overall operations of the electronic apparatus 3000. The processor 900 may include a single processor core (single core) or a plurality of processor cores (multiple cores). The processor 900 may process or execute programs and/or data stored in the memory device 940. In some embodiments, the processor 900 may control functions of the neuromorphic circuit 930 by executing programs stored in the memory device 940. The processor 900 may be implemented as a central processing unit (CPU), a graphics processing unit (GPU), an application processor (AP), or the like.

The memory device 940 may store various programs executable by the processor 900. For example, the memory device 940 may include one or more of the memory devices 100, 200, 300, or 400, described above.

The input device 910 may include a microphone, a camera, a scanner, a touch pad, a keyboard, a mouse, or various sensors.

The analog-to-digital converter 920 may convert an analog signal received from the input device 910 into a digital signal.

The communication device 950 may include various wired or wireless interfaces capable of communicating with external devices. For example, the communication device 950 may include: a wired local area network (LAN); a wireless local area network (WLAN) such as wireless fidelity (Wi-Fi); a wireless personal area network (WPAN) such as Bluetooth; a wireless universal serial bus (wireless USB); Zigbee; near field communication (NFC); radio-frequency identification (RFID); power line communication (PLC); or a communication interface connectable to a mobile cellular network such as a 3rd generation (3G), 4th generation (4G), 5th generation (5G), or long term evolution (LTE) cellular network.

The output device 960 may output signals in various forms. For example, the output device 960 may include a speaker, a printer, a monitor, a display panel, a beam projector, a hologrammer, or the like.

In a memory device according to some example embodiments, an oxygen scavenger layer may be provided between a recording material layer (e.g., a variable resistance oxide) and an insulating structure (e.g., a $SiO_2$). The oxygen scavenger layer is formed of a non-oxide material, and may include a semiconductor layer (e.g., Si), a nitride layer (e.g., SiN), and/or a metal layer. As the oxygen scavenger layer is provided between the recording material layer and the insulating structure, oxygen of the recording material layer may be moved to the oxygen scavenger layer, and thus, oxygen vacancies may be formed in the recording material layer. Alternatively or additionally, as the oxygen scavenger layer is provided, oxygen of the insulating structure is prevented or reduced in likelihood of occurrence and/or impact from being moved to the recording material layer, and thus, the oxygen vacancies of the recording material layer are prevented/reduced in likelihood of being decreased.

The resistance change characteristic of the recording material layer may be affected by oxygen vacancies, and, as the oxygen scavenger layer is be provided between the recording material layer and the insulating structure, the resistance change characteristic of the recording material layer may be normally maintained without being weakened. For example, the resistance of the recording material layer may smoothly change under a certain operating condition. Accordingly, the operation of the memory device may be more stable and/or the reliability of recorded information may be improved even in an environment in which the integration density is increased.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

It should be understood that various example embodiments described herein should be considered in a descriptive sense only and not for purposes of limitation. Descriptions of features and/or aspects within each embodiment should typically be considered as available for other similar features or aspects in other example embodiments. For example, variously described example embodiments are not necessarily mutually exclusive with one another. While one or more example embodiments have been described with reference to the figures, it will be understood by those of ordinary skill in the art that various changes in form and details may be made therein without departing from the spirit and scope as defined by the following claims.

What is claimed is:

1. A memory device comprising:
   a base substrate;
   an oxygen scavenger layer on the base substrate;
   a recording material layer on the oxygen scavenger layer, the recording material layer being in direct contact with the oxygen scavenger layer;
   a channel layer on the recording material layer;

a gate insulating layer on the channel layer; and
a gate electrode on the gate insulating layer,
wherein the oxygen scavenger layer comprises an element that forms oxygen vacancies in the recording material layer and does not comprise oxygen.

2. The memory device of claim 1, wherein the base substrate and the oxygen scavenger layer include a same material and correspond to one layer.

3. The memory device of claim 2, wherein the base substrate and the oxygen scavenger layer include semiconductor layers.

4. The memory device of claim 3, wherein the semiconductor layers include undoped semiconductor layers.

5. The memory device of claim 3, wherein the semiconductor layers include semiconductor layers doped with a dopant, and insulating layers are at both ends of the doped semiconductor layers.

6. The memory device of claim 2, wherein the base substrate and the oxygen scavenger layer include metal layers, and insulating layers are at both ends of the metal layers.

7. The memory device of claim 1, wherein the oxygen scavenger layer incudes a semiconductor layer doped with a dopant, and insulating layers are at both ends of the semiconductor layer.

8. The memory device of claim 1, wherein the oxygen scavenger layer comprises a metal layer, and insulating layers are at both ends of the metal layer.

9. The memory device of claim 1, wherein the element is a semiconductor element.

10. The memory device of claim 9, wherein the oxygen scavenger layer further comprises nitrogen (N).

11. The memory device of claim 1, wherein the oxygen scavenger layer comprises:
a first sub-material layer on the base substrate; and
a second sub-material layer on the first sub-material layer and in direct contact with the recording material layer.

12. The memory device of claim 11, wherein one of the first and second sub-material layers includes a layer comprising a semiconductor component, and the other one of the first and second sub-material layers includes a metal layer.

13. The memory device of claim 11, wherein one of the first and second sub-material layers includes a semiconductor layer, and the other one of the first and second sub-material layers includes a nitride layer.

14. The memory device of claim 12, wherein the layer comprising the semiconductor component comprises nitrogen.

15. The memory device of claim 13, wherein the semiconductor layer includes a silicon layer doped with a dopant, or includes an undoped silicon layer.

16. The memory device of claim 11, wherein one of the first and second sub-material layers includes a semiconductor layer doped with a dopant, and the other one of the first and second sub-material layers includes an undoped semiconductor layer.

17. The memory device of claim 1, wherein the base substrate includes an insulating structure comprising oxygen, and the oxygen scavenger layer includes a barrier configured to prevent movement of oxygen of the base substrate to the recording material layer.

18. The memory device of claim 1, wherein a plurality of gate electrodes are aligned on the gate insulating layer in a first direction, and isolation layers are between the plurality of the gate electrodes and insulate the plurality of the gate electrodes from each other.

19. The memory device of claim 18, wherein the base substrate has a cylindrical shape parallel to the first direction, and
the oxygen scavenger layer, the recording material layer, the channel layer, and the gate insulating layer are sequentially stacked on a cylindrical surface of the base substrate to surround the base substrate.

20. The memory device of claim 19, wherein the base substrate, the oxygen scavenger layer, the recording material layer, the channel layer, the gate insulating layer, the gate electrodes, and the isolation layers are on a substrate comprising a doping region,
a stack comprising the base substrate, the oxygen scavenger layer, the recording material layer, the channel layer, the gate insulating layer, and the channel layer is perpendicular to a surface of the substrate and has one end of the stack in contact with the doping region, and
the gate electrodes and the isolation layers are in parallel to the substrate and surround the stack.

21. The memory device of claim 20, wherein the other end of the stack opposite to the one end of the stack is in contact with a drain region, and a bit line is connected to the drain region.

22. The memory device of claim 1, wherein the recording material layer comprises at least one of a variable resistance material and a phase change material.

23. An electronic device comprising the memory device of claim 1.

24. An electronic device comprising:
an oxygen scavenger layer;
a recording material layer on the oxygen scavenger layer, the recording material layer directly contacting the oxygen scavenger layer; and
a channel layer on the recording material layer,
wherein the oxygen scavenger layer comprises an element that creates oxygen vacancies in the recording material layer in response to voltages applied to the channel layer, and does not comprise oxygen.

25. The electronic device of claim 24, wherein the oxygen scavenger layer serves as an insulating substrate.

26. The electronic device of claim 24, wherein a thickness of the oxygen scavenger layer is between 30 nm and 70 nm.

27. The electronic device of claim 26, wherein the thickness of the oxygen scavenger layer is about 50 nm.

28. The electronic device of claim 24, further comprising:
a gate electrode layer on the channel layer; and
a source electrode on the channel layer,
wherein the oxygen scavenger layer is configured to create oxygen vacancies in the recording material layer in response to a voltage applied to the gate electrode layer or to the source electrode.

29. A method of fabricating a memory device, the method comprising:
forming a stack structure by alternately and repeatedly depositing sacrificial layers and isolation layers on a substrate;
forming a channel hole penetrating the stack structure;
sequentially forming a gate insulating layer, a channel layer, a recording material layer, and an oxygen scavenger layer on an inner surface of the channel hole;
filling, with a buried material, an inner space of the channel hole remaining after the oxygen scavenger layer is formed;
forming gate holes by removing the sacrificial layers; and
depositing an electrode material in the gate holes, wherein the oxygen scavenger layer comprises an element that forms oxygen vacancies in the recording material layer and does not comprise oxygen.

30. The method of claim 29, further comprising, after the forming of the gate insulating layer and the channel layer on the inner surface of the channel hole and before the forming of the recording material layer, removing an insulating material and a channel material that are deposited on a bottom surface of the channel hole.

31. The method of claim 29, wherein the oxygen scavenger layer and the buried material are formed of a same material, and correspond to one layer.

32. The method of claim 29, wherein the forming of the oxygen scavenger layer comprises:
forming a first sub-material layer on an inner surface of the recording material layer; and
forming a second sub-material layer on an inner surface of the first sub-material layer.

33. The method of claim 32, wherein one of the first sub-material layer and the second sub-material layer includes a semiconductor layer, and the other one of the first sub-material layer and the second sub-material layer includes a metal layer.

34. The method of claim 32, wherein one of the first sub-material layer and the second sub-material layer includes a semiconductor layer, and the other one of the first sub-material layer and the second sub-material layer includes a nitride layer.

35. The method of claim 32, wherein one of the first sub-material layer and the second sub-material layer includes a doped silicon layer, and the other one of the first sub-material layer and the second sub-material layer includes an undoped silicon layer.

36. The method of claim 29, wherein the oxygen scavenger layer comprises a semiconductor layer.

37. The method of claim 36, wherein the semiconductor layer includes a silicon layer doped with a dopant or is an undoped silicon layer, and, when the semiconductor layer includes the doped silicon layer, insulating layers are formed at both ends of the doped silicon layer in a direction perpendicular to the substrate.

38. The method of claim 29, wherein the oxygen scavenger layer comprises a metal layer, and insulating layers are formed at both ends of the metal layer in a direction perpendicular to the substrate.

39. The method of claim 29, wherein the oxygen scavenger layer is formed by using plasma-enhanced atomic layer deposition (PEALD).

40. The method of claim 29, wherein the channel layer and the oxygen scavenger layer are formed of a same material under same conditions.

* * * * *